United States Patent
Baek et al.

(10) Patent No.: US 10,468,558 B2
(45) Date of Patent: Nov. 5, 2019

(54) SEMICONDUCTOR LIGHT EMITTING DEVICE AND METHOD FOR MANUFACTURING SAME

(71) Applicant: SEMICON LIGHT CO., LTD., Gyeonggi-do (KR)

(72) Inventors: Seung Ho Baek, Gyeonggi-do (KR); Soo Kun Jeon, Gyeonggi-do (KR)

(73) Assignee: SEMICON LIGHT CO., LTD., Gyeonggi-do (KR)

( * ) Notice: Subject to any disclaimer, the term of this patent is extended or adjusted under 35 U.S.C. 154(b) by 0 days.

(21) Appl. No.: 15/540,188

(22) PCT Filed: Dec. 30, 2015

(86) PCT No.: PCT/KR2015/014509
§ 371 (c)(1),
(2) Date: Sep. 5, 2017

(87) PCT Pub. No.: WO2016/108636
PCT Pub. Date: Jul. 7, 2016

(65) Prior Publication Data
US 2018/0040779 A1 Feb. 8, 2018

(30) Foreign Application Priority Data
Dec. 30, 2014 (KR) .......................... 10-2014-0193883

(51) Int. Cl.
*H01L 33/00* (2010.01)
*H01L 33/48* (2010.01)
(Continued)

(52) U.S. Cl.
CPC .......... *H01L 33/486* (2013.01); *H01L 33/502* (2013.01); *H01L 33/54* (2013.01);
(Continued)

(58) Field of Classification Search
USPC ......... 257/98, 81, 82, 91, 99, 100, 116, 117, 257/432–437, 749; 438/25–28
See application file for complete search history.

(56) References Cited

U.S. PATENT DOCUMENTS

| | | | |
|---|---|---|---|
| 2010/0244077 A1 | 9/2010 | Yao | ................................ 257/98 |
| 2012/0049232 A1* | 3/2012 | Okabe | ..................... H01L 33/38 |
| | | | 257/98 |

(Continued)

FOREIGN PATENT DOCUMENTS

| | | | | |
|---|---|---|---|---|
| KR | 10-2003-0030587 | 4/2003 | ............. | H01L 33/00 |
| KR | 10-2012-0061376 | 6/2012 | ............. | H01L 33/50 |

(Continued)

OTHER PUBLICATIONS

ISR dated Apr. 28, 2016 in PCT/KR2015/014509 published as WO 2016/108636.

*Primary Examiner* — Niki H Nguyen
(74) *Attorney, Agent, or Firm* — Harness, Dickey & Pierce, P.L.C.

(57) ABSTRACT

The present disclosure relates to a semiconductor light emitting device and a method for manufacturing the same, in which the semiconductor light emitting device includes a semiconductor light emitting chip having a semiconductor light emitting part for generating light by electron-hole recombination, and at least one electrode electrically connected to the semiconductor light emitting part; a wall placed on a lateral side of the semiconductor light emitting part, with the wall having an elevated upper end caused by surface tension effects; and an encapsulant arranged in a bowl that is defined by the upper end of the wall and the semiconductor light emitting part, with the encapsulant for transmitting therethrough a light from the semiconductor light emitting part.

6 Claims, 28 Drawing Sheets

(51) Int. Cl.
  *H01L 33/50* (2010.01)
  *H01L 33/54* (2010.01)
  *H01L 33/60* (2010.01)
  *H01L 33/62* (2010.01)
  *H01L 21/56* (2006.01)
  *H01L 23/552* (2006.01)
  *H01L 33/06* (2010.01)
  *H01L 33/32* (2010.01)
  *H01L 33/46* (2010.01)

(52) U.S. Cl.
  CPC .............. *H01L 33/60* (2013.01); *H01L 33/62* (2013.01); *H01L 21/568* (2013.01); *H01L 23/552* (2013.01); *H01L 33/0079* (2013.01); *H01L 33/06* (2013.01); *H01L 33/32* (2013.01); *H01L 33/46* (2013.01); *H01L 33/505* (2013.01); *H01L 2224/04105* (2013.01); *H01L 2224/19* (2013.01); *H01L 2924/1815* (2013.01); *H01L 2933/005* (2013.01); *H01L 2933/0033* (2013.01); *H01L 2933/0041* (2013.01); *H01L 2933/0058* (2013.01); *H01L 2933/0066* (2013.01)

(56) References Cited

U.S. PATENT DOCUMENTS

| | | | |
|---|---|---|---|
| 2012/0142124 A1 | 6/2012 | Yoo et al. | 438/16 |
| 2013/0037842 A1 | 2/2013 | Yamada et al. | 257/98 |
| 2013/0126926 A1 | 5/2013 | Sakai et al. | 257/98 |
| 2014/0071689 A1* | 3/2014 | Yoon | F21V 7/00 |
| | | | 362/296.01 |
| 2014/0203305 A1* | 7/2014 | Kawano | H01L 33/486 |
| | | | 257/88 |
| 2014/0374786 A1 | 12/2014 | Bierhuizen | 257/98 |
| 2016/0149088 A1* | 5/2016 | Yan | H01L 25/0753 |
| | | | 257/48 |
| 2017/0301836 A1* | 10/2017 | Park | H01L 33/54 |

FOREIGN PATENT DOCUMENTS

| | | | |
|---|---|---|---|
| KR | 10-2012-0125350 | 11/2012 | ............ H01L 33/48 |
| KR | 10-2013-0056193 | 5/2013 | ............ H01L 33/50 |
| KR | 10-2014-0133565 | 11/2014 | ............ H01L 33/48 |

\* cited by examiner

SEMICONDUCTOR LIGHT EMITTING DEVICE AND METHOD FOR MANUFACTURING SAME

CROSS-REFERENCE TO RELATED APPLICATIONS

This application is a national phase application of PCT Application No. PCT/KR2015/014509, filed on Dec. 30, 2015, which claims benefit of Korean Patent Application No. 10-2014-0193883n, filed on Dec. 30, 2014. The entire disclosure of the applications identified in this paragraph are incorporated herein by reference.

FIELD

The present disclosure relates generally to a light emitting device and a method for manufacturing the same. In particular, it relates to a chip-scale semiconductor light emitting device and a method for manufacturing the same.

An example of the semiconductor light emitting device is a Group III-nitride semiconductor light emitting device. The Group III-nitride semiconductor is composed of a compound containing $Al(x)Ga(y)In(1-x-y)N(0 \leq x \leq 1, 0 \leq y \leq 1, 0 \leq x+y \leq 1)$. Another example of the semiconductor light emitting device is a GaAs-based semiconductor light emitting device used for emitting red light.

BACKGROUND ART

This section provides background information related to the present disclosure which is not necessarily prior art.

A semiconductor light emitting device is manufactured by an EPI process, a chip fabrication process and a package process. However, there can be unexpected events in each manufacturing process, causing the occurrence of defects in a product. If these defects found in the respective manufacturing processes are not eliminated properly in time, it means that a potentially defective product will eventually have to go through post-processing, thereby lowering the overall production yield.

FIG. 1 is a schematic illustration showing an exemplary process of fabricating a semiconductor light emitting chip from a wafer. A disk-shaped wafer is prepared with a raw material such as silicon or sapphire, and this disk-shaped wafer is then subjected to an epitaxial growth process to grow multiple semiconductor layers having a PN junction. Next, the processes of electrode formation, etching and protective film formation are performed to obtain an epi wafer 1 with semiconductor light emitting chips (see FIG. 1a). Then, the epi wafer 1 is attached on a dicing tape 3 as illustrated in FIG. 1b and FIG. 1c, and divided into individual semiconductor light emitting chips 101 by a scribing process as illustrated in FIG. 1d. This is followed by testing, classification, and sorting. For sorting, a sorter 5 as shown in FIG. 1e is used such that semiconductor light emitting chips 101 may be sorted on a fixing layer 13 (e.g., a tape) as shown in FIG. 1f in compliance with regulations required for post-processing such as a packaging process. After that, a visual inspection is carried out.

FIG. 2 is a schematic illustration showing an exemplary process of manufacturing a semiconductor light emitting device package with semiconductor light emitting chips. In a packaging process, semiconductor light emitting chips 101 are die-bonded on a lead frame 4 with a die bonder 501 as shown in FIG. 2a. Then processes including wire-bonding, phosphor encapsulation, property testing, trimming, taping and the like are carried out to produce a semiconductor light emitting device package as shown in FIG. 2b. Optionally, a semiconductor light emitting device package can be produced by mounting semiconductor light emitting chips 101 on a submount with an external electrode formed thereon, such as a PCB. Die bonding indicates a process of bonding semiconductor light emitting chips 101 on a lead frame (for example, 4), PCB or circuit tape, and a die bonder (for example, 501) is a tool used therefor. To keep abreast with an increased trend of smaller semiconductor light emitting chips 101, bonding positions and precise angular positioning of the semiconductor light emitting chips 101 are now more required than ever.

FIG. 3 is a schematic illustration showing an example of semiconductor light emitting chips arrayed on a tape using a sorter. As described with reference to FIG. 1f, semiconductor light emitting chips 101 are sorted and prepared such that they are in compliance with regulations required for post-processing such as a packaging process. The sorter 5 arranges semiconductor light emitting chips 101 on a flat tape 13 in an array of designated rows and columns, maintaining a certain spaced interval from an initially placed semiconductor light emitting chips 101 on the tape 13. In the course of arranging the semiconductor light emitting chips 101, it is possible that any one of them may slightly be turned at an angle (see 15), or the sorter 5 running at high speeds may cause some chips to get thrown off of the tape 13, thereby creating a vacancies 14. A vacancy may also be created by a defective semiconductor light emitting chip 16 that has been taken out based on test results. It could be an option to run the sorter 5 to reduce these problems, but the processing time will be increased by doing so.

If chips in the rows and columns are not arranged in a completely precise manner by the sorter 5, the quality of a product will largely be influenced by the type of a post-process that follows. For example, in the case of bonding the semiconductor light emitting chips 101 on a lead frame 4 with a die bonder 501, the die bonder 501 will recognize a shape of electrodes in a semiconductor light emitting chip 101 bonded onto the tape 13 as well as a shape of the lead frame 4, so as to calibrate position, angle and so on of the chip to be bonded. Therefore, a packaging process is not greatly affected as long as the semiconductor light emitting chips 101 are not arrayed in an abnormally severe condition by the sorter 5. Meanwhile, if the semiconductor light emitting chips 101 arrayed on the tape 13 are to be used directly for a post-process, or rearranged by the sorter 5 to be in compliance with regulations required, any semiconductor light emitting chip 101 that has been skewed or tilted by degrees greater than a given tolerance level will have to be corrected again, and any vacancy will have to be filled with a semiconductor light emitting chip 101. These additional processes lower the process efficiency.

FIG. 4 is a schematic illustration showing an exemplary embodiment of a semiconductor light emitting device depicted in U.S. Pat. No. 6,650,044, in which the semiconductor light emitting device includes a substrate 1200, LEDs and an encapsulant 1000. The LEDs are in the form of flip chips, and include a growth substrate 100 and a stack of layers sequentially deposited on the growth substrate 100, including a first semiconductor layer 300 having a first conductivity type, an active layer 400 for generating light by electron-hole recombination, and a second semiconductor layer 500 having a second conductivity type different from the first conductivity type. A metal reflective film 950 is formed on the second semiconductor layer 500, for reflecting light towards the growth substrate 100, and an electrode 800 is formed on an etched exposed portion of the first semiconductor layer 300. The encapsulant 1000 contains a phosphor, and is formed such that it surrounds the growth substrate 100 and the semiconductor layers 300, 400, 500. A conductive adhesive 830, 970 is used to bond the LEDs to the substrate 1200 having electrical contacts 820, 960.

FIG. 5 is a schematic illustration showing an exemplary embodiment of a method for manufacturing the semiconductor light emitting device depicted in U.S. Pat. No. 6,650,044. Firstly, a plurality of LEDs 2A-2F is placed on the substrate 1200. The substrate 1200 is made of silicon, and a growth substrate 100 (see FIG. 4) of each LED is made of sapphire or silicon carbide. Electrical contact 820, 960 (see FIG. 4) are formed on the substrate 1200, and each LED is bonded to the electrical contacts 820, 960. Next, a stencil 6 having openings 8A-8F corresponding to the LEDs is prepared at the substrate 1200, and an encapsulant 1000 (see FIG. 4) is formed such that the electrical contacts 820, 960 are partially exposed. Later, the stencil 6 is removed, a curing process is carried out, and the substrate 1200 is subjected to sawing or scribing, so as to obtain individual, separated semiconductor light emitting devices.

FIG. 6 is a schematic illustration for describing the problems that can occur while forming an encapsulant collectively for a plurality of semiconductor light emitting chips. Here, after placing guides 21 on the edges of a tape 13 or a substrate, the plurality of semiconductor light emitting chips 101 is covered with an encapsulant 17 which is then pressed flat. However, as described above, there can be vacancies 14 without any semiconductor light emitting chip 101 on the tape 13. In these vacant locations without semiconductor light emitting chips, the encapsulant 17 can sag down slightly, which in turn has an adverse effect on the encapsulant 17 around the neighboring semiconductor light emitting chips 101. As a result, those adversely affected semiconductor light emitting chips (a combination of the encapsulant 17 and the semiconductor light emitting chips 101) may have color coordinates or optical properties different from the intended values.

Because of the aforementioned problems, an additional process may be carried out to rearrange a semiconductor light emitting chip 101 at any vacancy 14 on the tape 13, but this leads to an increase in the number of processes and a decrease in the process efficiency. Meanwhile, instead of taking out a defective semiconductor light emitting chip 16, a process of forming an encapsulant 17 may be performed to prevent the presence of a vacancy from affecting the state of the encapsulant 17. But still, this case also requires an additional process of taking out a defective semiconductor light emitting chip through a visual inspection, and materials are wasted accordingly.

Optionally, after an encapsulant 17 is formed, the encapsulant 17 may be cut with a cutter 31 to obtain individual, separated semiconductor light emitting chips. In this case, however, those cut faces of the encapsulant 17 have a lower light extraction efficiency as they were cut and sectioned with the cutter 31. Moreover, if semiconductor light emitting chips 101 are out of alignment even slightly on the tape 13, a number of defective semiconductor light emitting chips may occur during the cutting process with the cutter 31.

DISCLOSURE

The problems to be solved by the present disclosure will be described in the latter part of the best mode for carrying out the invention.

This section provides a general summary of the present disclosure and is not a comprehensive disclosure of its full scope or all of its features.

According to one aspect of the present disclosure, there is provided a semiconductor light emitting device including: a semiconductor light emitting chip having a semiconductor light emitting part for generating light by electron-hole recombination, and at least one electrode electrically connected to the semiconductor light emitting part; a wall placed on a lateral side of the semiconductor light emitting part, with the wall having an elevated upper end caused by surface tension effects; and an encapsulant arranged in a bowl that is defined by the upper end of the wall and the semiconductor light emitting part, with the encapsulant for transmitting therethrough a light from the semiconductor light emitting part.

According to another aspect of the present disclosure, there is provided a method for manufacturing a semiconductor light emitting device, the method including: placing a dam having an opening formed therein onto a base, and placing a semiconductor light emitting chip onto an exposed portion of the base through the opening, with the semiconductor light emitting chip having a semiconductor light emitting part for generating light by electron-hole recombination and at least one electrode electrically connected to the semiconductor light emitting part; forming a wall between a lateral side of the dam and a lateral side of the semiconductor light emitting part, with the wall having an elevated upper end caused by surface tension effects; and forming an encapsulant in a bowl that is defined by the upper end of the wall and the semiconductor light emitting part.

ADVANTAGEOUS EFFECTS

The advantageous effects of the present disclosure will be described in the latter part of the best mode for carrying out the invention.

DETAILED DESCRIPTION

The present disclosure will now be described in detail with reference to the accompanying drawings. The following description is presented for purposes of illustration only and not of limitation as the scope of the invention is defined by the appended claims. For instance, the steps mentioned in any of the method or process may be executed in any order and are not necessarily limited to the order provided. Also, any reference to singular includes plural embodiments, and vice versa.

Figure 7:
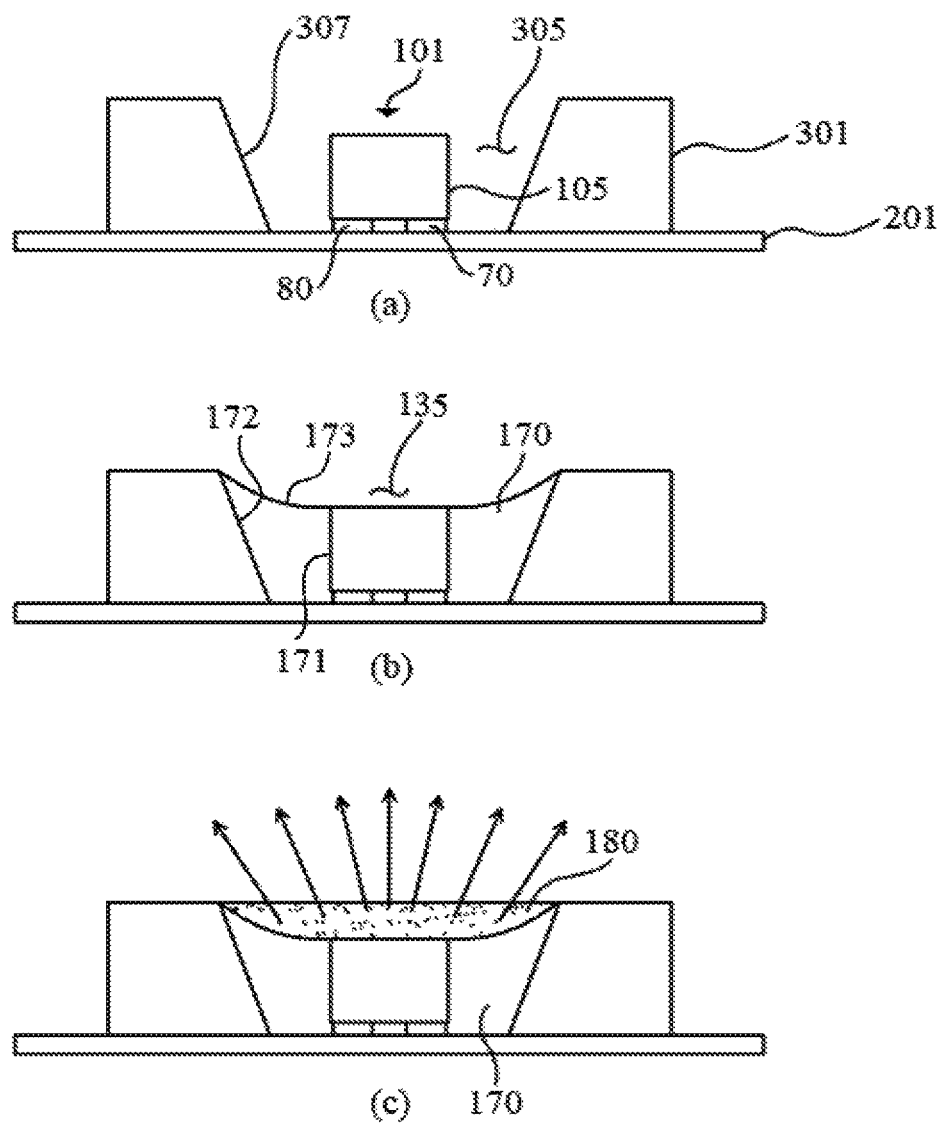
FIG. 7 is a schematic illustration for describing an exemplary embodiment of a method for manufacturing a semiconductor light emitting device according to the present disclosure.

FIG. 7 is a schematic illustration for describing an exemplary embodiment of a method for manufacturing a semiconductor light emitting device according to the present disclosure. In this method for manufacturing a semiconductor light emitting device, first of all, as shown in FIG. 7a, a dam 301 (a mask) having an opening 305 formed therein is arranged on a base 201, and a semiconductor light emitting chip 101 is then placed on an exposed portion of the base 201 through the opening 305. Here, the semiconductor light emitting chip 101 may be placed after the dam 301 is first arranged on the base 201, or the semiconductor light emitting chip 101 may be placed on the base 201 before the dam 301 is arranged on the base 201. The semiconductor light emitting chip 101 has a semiconductor light emitting part 105 for generating light by electron-hole recombination, and at least one electrode 80, 70 electrically connected to the semiconductor light emitting part 105. In this exemplary embodiment, the semiconductor light emitting chip 101 is a flip chip and the at least one electrode 80, 70 thereof includes a first electrode 80 and a second electrode 70. In this step shown in FIG. 7a, the first electrode 80 and the second electrode 70 are arranged on one lateral side of the semiconductor light emitting part 105, and the semiconductor light emitting chip 101 is placed in the opening 305 of the dam 310 in such a way that the first electrode 80 and the second electrode 70 come into contact with the base 201. In the present disclosure, the semiconductor light emitting chip 101 is not particularly limited to a flip chip, and a lateral chip or a vertical chip may also be employed.

Continuing with reference to FIG. 7b, a wall 170 is formed in the opening 305, i.e. between a lateral side 307 of the dam 301 and a lateral side of the semiconductor light emitting part 105. An upper end 173 of the wall 170 is elevated along the lateral side 307 of the dam 301, caused by surface tension effects. For instance, the lateral side 307 of the dam 301 is inclined with respect to the base 201. The wall 170 may be preferably made from materials having a lower transmission or non-transmissive materials (e.g., light reflective materials), although transmissive materials should not be completely excluded therefrom. The wall can be made from various materials such as a resin (silicon-based or epoxy-based), and if the wall is made from a material having a reflectivity of at least 50%, it can be used as a reflector. Further, the wall 170 may be made from an EMC (electromagnetic compatibility) material to prevent electromagnetic interference.

The upper end 173 of the wall 170 is formed as the non-transmissive material that was supplied between the lateral side 307 of the dam 301 and the lateral side of the semiconductor light emitting part 105 arises along the lateral side 307 of the dam 301, caused by surface tension effects. The shape of the upper end 173 of the wall 170 varies depending on the rising degrees of a light reflective material along the dam 301 and the semiconductor light emitting part. In this exemplary embodiment, under surface tension effects, the light reflective material arises higher along the lateral side 307 of the dam 301 than along the lateral side of the semiconductor light emitting part 105. Accordingly, when seen from the base 201, the upper end 173 of the wall 170 thus formed is higher at the lateral side 307 (the outer end) of the dam 301 than at the lateral side of the semiconductor light emitting part 105. It is desirable that the wall 170 would not cover the upper side of the semiconductor light emitting part 105 so as not to interfere with incidence of light from the semiconductor light emitting part 105 upon an encapsulant 180. In this exemplary embodiment, the wall 170 thus formed reaches almost to the top of the lateral side of the semiconductor light emitting part 105.

Next, the resin used for the wall is soft-cured or cured, which is then formed into an encapsulant 180 in a bowl 135 that is defined by the upper end 173 of the wall 170 and the semiconductor light emitting part 105, as shown in FIG. 7c. For instance, the encapsulant 180 may be obtained by dotting or printing a phosphor-containing resin or silicon onto the bowl 135. In this exemplary embodiment, the wall 170 has an inner side 171 in contact with the semiconductor light emitting part 105, an outer side 172 in contact with the lateral side 307 of the dam 301, and an upper side or upper end 173 connecting the inner side 171 and the outer side 172. The upper end 173 may extend to the lateral side of the semiconductor light emitting part 105. The bowl 135 indicates a space defined by the upper end 173 of the wall 170 and the upper and lateral sides of the semiconductor light emitting part 105. As the name indicates, although the bowl 135 is formed in a bowl shape as shown in FIG. 7b, its shape may change if the wall 170 is only raised to a height between the top and bottom of the lateral side of the semiconductor light emitting part 105.

As described above, the upper end 173 of the wall 170 has an elevated shape due to surface tension effects. In this exemplary embodiment, at least a portion of the upper end 173 of the wall 170 is concave down relative to the lower end of the wall 170. The degree of concavity may vary depending on an amount of the resin used for forming the wall 170. If a small amount of the resin is used, the degree of concavity will be very large, while if a large amount of the resin is used, the degree of concavity will be small. For instance, the upper end of the wall can be formed as shown in FIG. 9c. Since the lateral side 307 of the dam 301 is inclined with respect to the base 201 as described above, the outer lateral side 172 of the wall 170 in contact with the lateral side 307 of the dam 301 is also inclined. When seen in a cross-sectional view of the wall 170, an outer edge of the corner of the upper end 173 of the wall 170 where the upper side and outer lateral side 172 of the wall 170 meet may be pointed.

The base 201 and the dam 301 are then separated to obtain a semiconductor light emitting device which includes semiconductor light emitting chip 101, the wall 170 and the encapsulant 180. Alternatively, the base 201 may be removed to obtain a semiconductor light emitting device which includes the semiconductor light emitting chip 101, the wall 170, the encapsulant 180 and the dam 301. Alternatively, if the base 201 has a structure allowing currents of opposite polarities to be supplied to the first electrode 80 and the second electrode 70, respectively, the semiconductor light emitting chip 101, the wall 170, the encapsulant 180, the dam 301 and the base 201 can all be included in a semiconductor light emitting device thus obtained.

Figure 4:
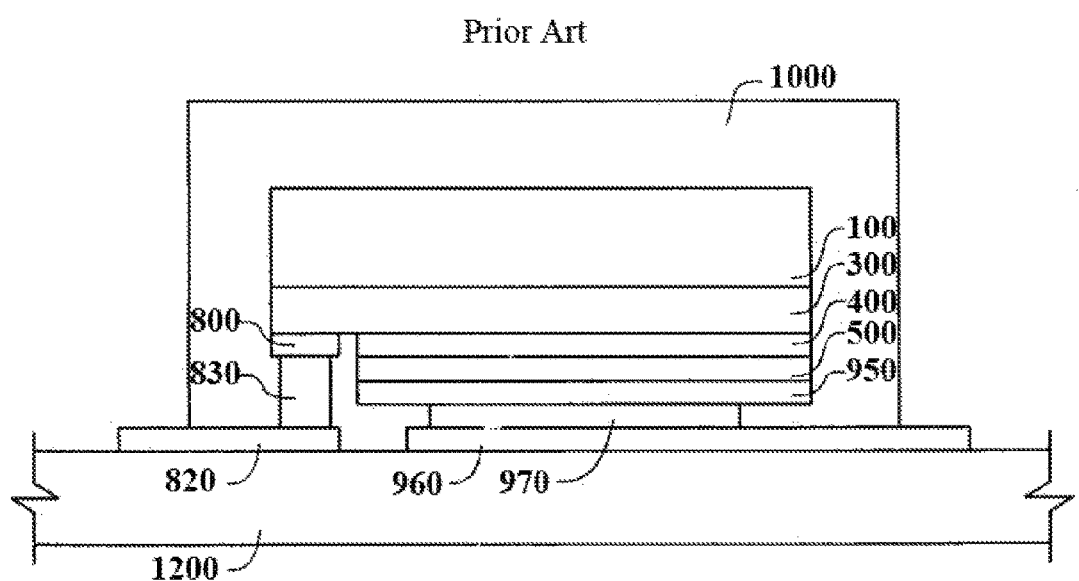
FIG. 4 is a schematic illustration showing an exemplary embodiment of a semiconductor light emitting device depicted in U.S. Pat. No. 6,650,044.
Figure 5:
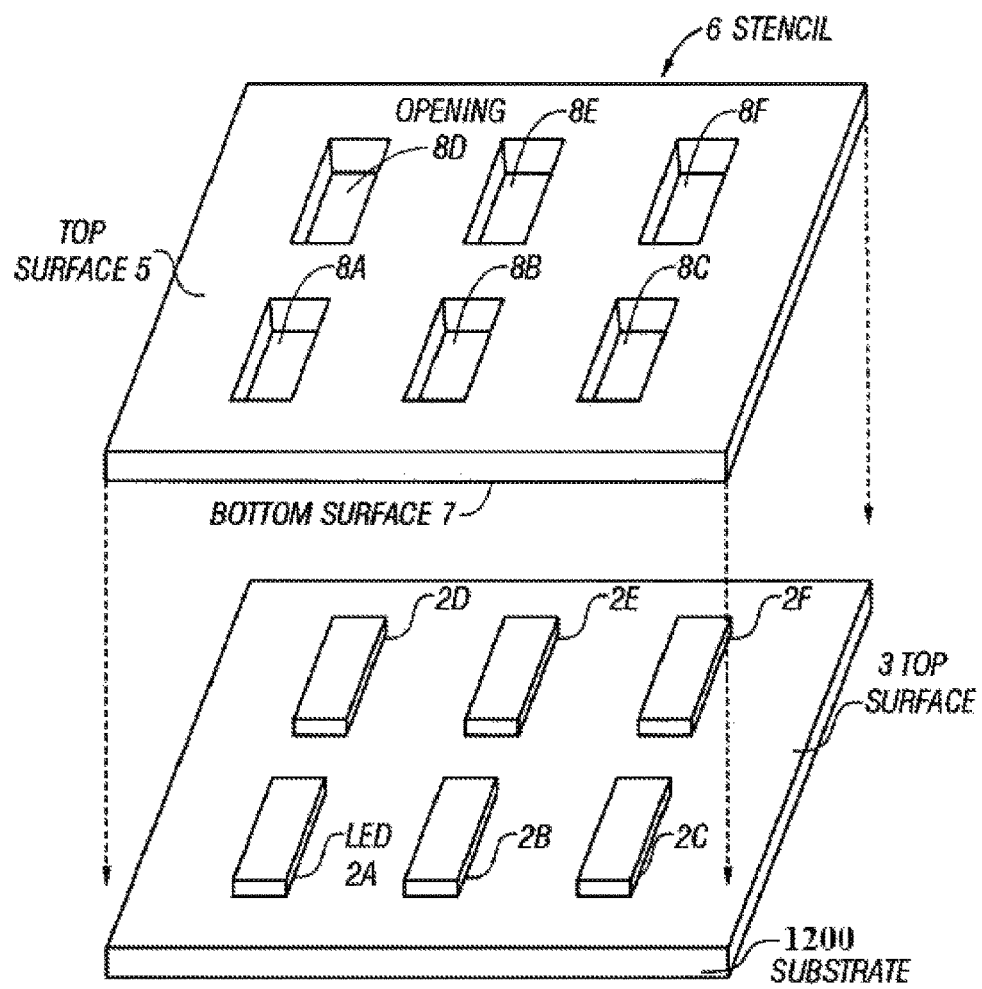
FIG. 5 is a schematic illustration showing an exemplary embodiment of a method for manufacturing the semiconductor light emitting device depicted in U.S. Pat. No. 6,650,044.
Figure 6:
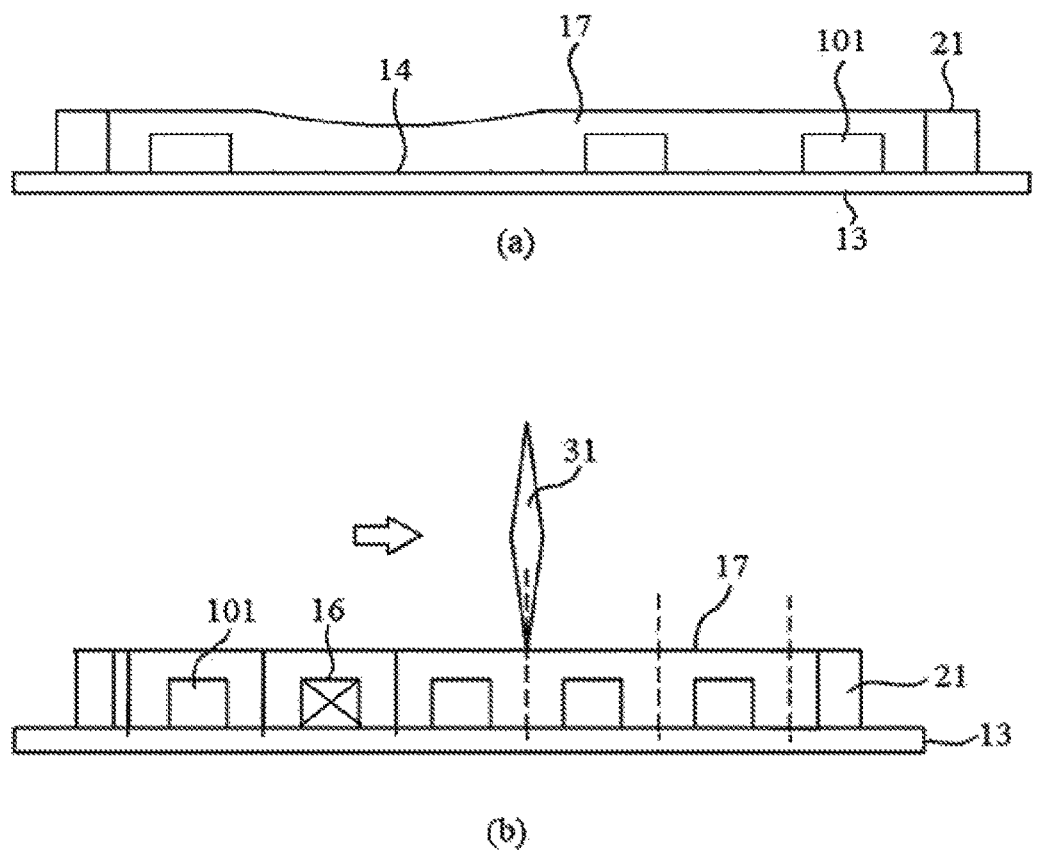
FIG. 6 is a schematic illustration for describing the problems that can occur while forming an encapsulant collectively for a plurality of semiconductor light emitting chips.

In this method for manufacturing a semiconductor light emitting device and a semiconductor light emitting device accordingly, light hardly transmits the wall 170, and light coming out from the top of the semiconductor light emitting part 105 penetrates the encapsulant 180 and is emitted. Therefore, this structure plays a favorable role to make the beam angle of emitted light narrower (e.g., between 110 and 140 degrees, or even smaller) than that of the semiconductor light emitting device illustrated in FIG. 4. Moreover, as the beam angle of light is relatively narrow, and only a required amount of a phosphor is contained in the bowl 135, a difference in the excitation degrees of the phosphor by light is smaller than that of the semiconductor light emitting device as shown in FIG. 4. In addition, this exemplary embodiment presents a very advantageous structure for producing a semiconductor light emitting device of reduced dimensions, as compared with a conventional semiconductor light emitting device produced by placing a leadframe into a mold having a cavity, mounting a semiconductor light emitting chip 101 onto the lead frame, and filling the cavity with an encapsulant 180. Further, in presence of the dam 301, the wall 170 may be formed in a compact state around the semiconductor light emitting chip 101 such that the resulting semiconductor light emitting device would not be significantly larger than the semiconductor light emitting chip 101, producing a CSP (Chip Scale Package)-like package. In addition, as aforementioned, since only a required amount of phosphor 135 is contained in the bowl 135, costs are reduced. In this type of a semiconductor light emitting device, the first electrode 80 and the second electrode 70 are exposed towards the lower end of the wall 170, and this feature causes the semiconductor light emitting device to have a very efficient structure as an SMD (Surface Mount Device) that is directly mounted onto a circuit board like a PCB.

Figure 8:
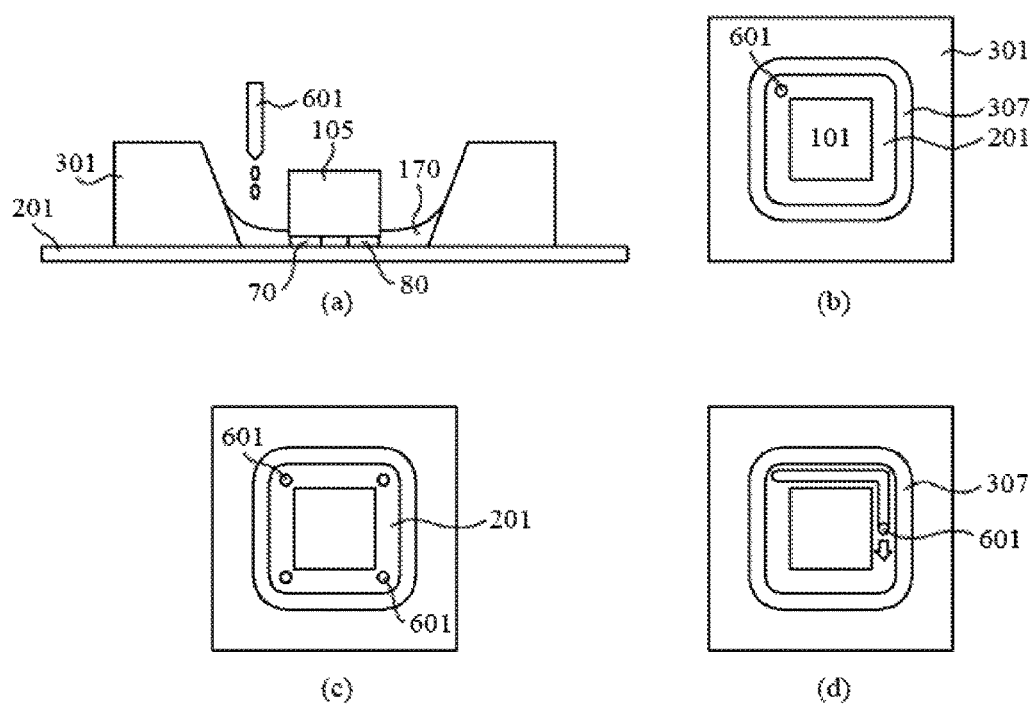
FIG. 8 is a schematic illustration for describing exemplary methods for forming a wall.

FIG. 8 is a schematic illustration for describing exemplary methods for forming the wall 170. As shown in FIG. 8a, a non-transmissive material is fed between the lateral side 307 of the dam 301 and the lateral side of the semiconductor light emitting part 105, by means of a dispenser 601. The semiconductor light emitting part 105 may be composed of a material such as a semiconductor or sapphire. Exemplary materials for the dam 301 include Al, Cu, Ag, Cu—Al alloys, Cu—Ag alloys, Cu—Au alloys, and SUS (stainless steel). The dam 301 may be a member which is either plated or has a film formed on the surface. The dam 301 may be made from a non-metallic material (e.g., plastics) in a wide range of colors or light reflectances.

Although the opening 305 formed in the dam 301 may have different shapes, its corners are preferably rounded, considering that a non-transmissive material is spread or arises along the lateral side 307 of the dam 301, caused by surface tension effects. Referring now to FIG. 8b, when the dispenser 601 feeds a non-transmissive material from the corner of one side of the opening 305, the non-transmissive material will naturally spread along the lateral side 307 of the dam 301 and the lateral side of the light emitting part 105, thereby forming a wall 170. When there are multiple dispensing points, the wall 170 can be formed even faster, as shown in FIG. 8c. Alternatively, the dispenser 601 may be designed to be movable as shown in FIG. 8d, to feed a non-transmissive material.

Figure 9:
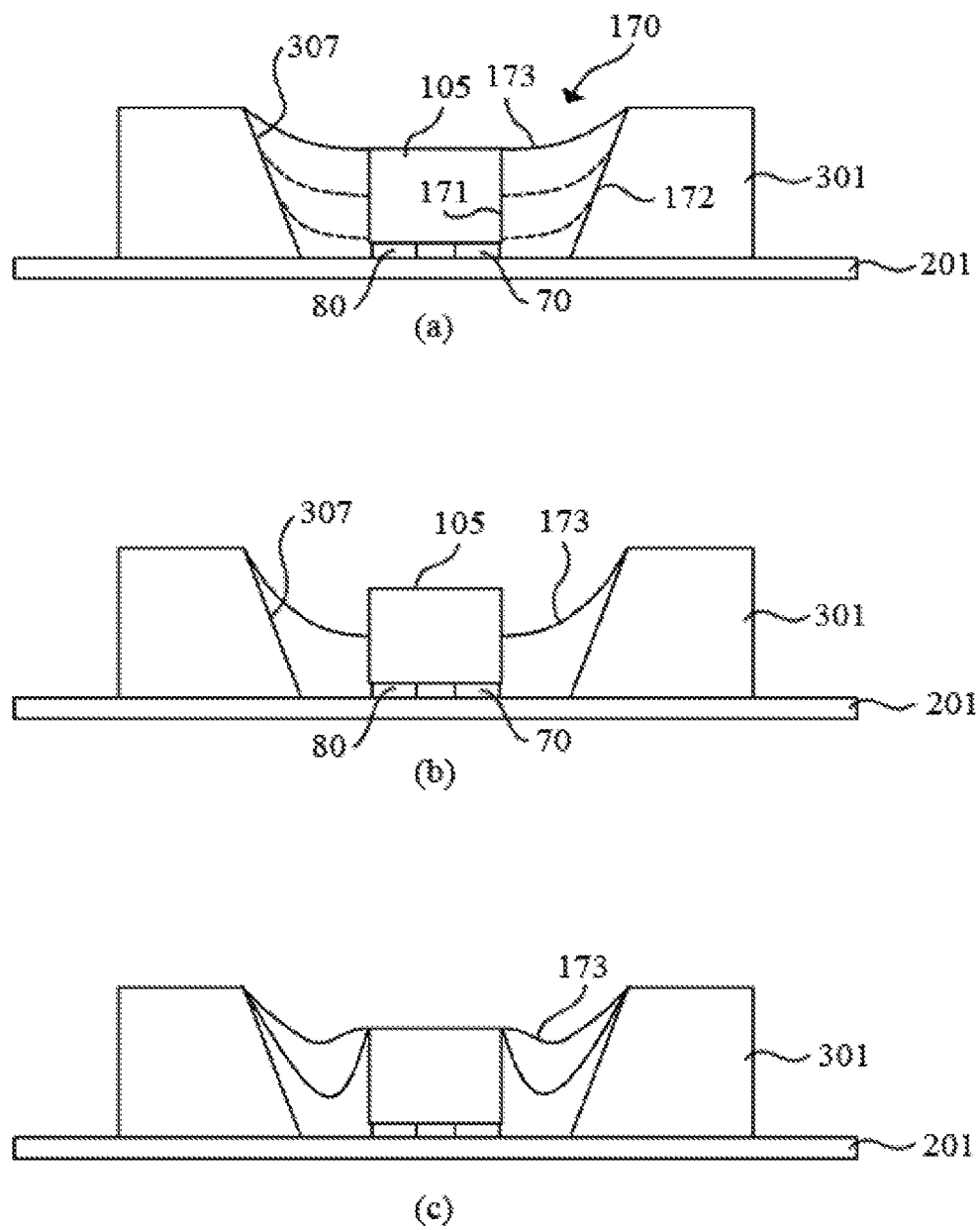
FIG. 9 is a schematic illustration for describing exemplary shapes of a wall.

FIG. 9 illustrates different shapes of the wall 170. The non-transmissive material advantageously has a low viscosity to be able to arise under surface tension effects. With a proper choice of the viscosity of the non-transmissive material, the wall 170 may be formed such that the local minimum portion of the wall is equally as high as the top of the lateral side of the semiconductor light emitting part 105, while the upper end 173 or outer edge of the wall 170 is being allowed to go entirely up to the top of the lateral side 307 of the dam 301 on either side of the corner, as shown in FIG. 9a. In an alternative example shown in FIG. 9b, the wall 170 may be formed such that the outer edge of the wall 170 reaches nearly to the top of the lateral side 307 of the dam 301 on either side of the corner, with the local minimum portion of the wall lies between the top and bottom of the lateral side of the semiconductor light emitting part 105. In this case, the bowl 135 has a slightly different shape from the one in FIG. 9a. In another alternative example, while the upper end 173 of the wall 170 arises due to surface tension effects and is curved similar to those in FIG. 9a and FIG. 9b, it may form a wavy curve as shown in FIG. 9c.

Figure 10:
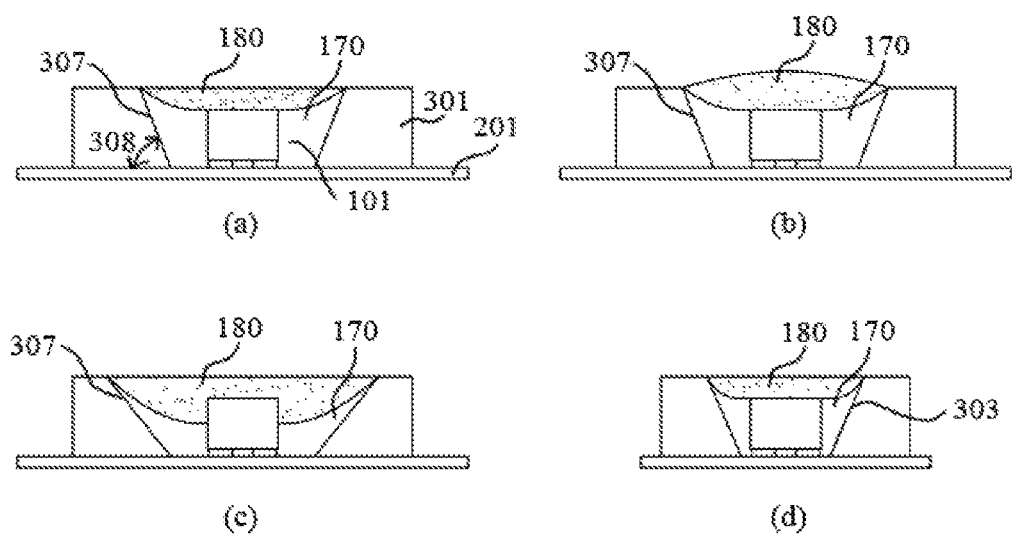
FIG. 10 is a schematic illustration for describing exemplary walls which vary based on an angle of inclination with respect to a lateral side of a dam.

FIG. 10 is a schematic illustration for describing exemplary walls 170 which vary based on an angle of inclination 308 with respect to the lateral side 307 of the dam 301. The beam angle of light emitted from a semiconductor light emitting device is determined according to the shape of the encapsulant 180, and the top face of the encapsulant 180 may be flat as shown in FIG. 10a, or convex as shown in FIG. 10b. Moreover, the beam angle may be determined according to the shape of the bowl 135, and the shape of the bowl 135 in turn affects the shape of the upper end 173 of the wall 170. Further, the shape of the upper end 173 of the wall 170 varies depending on a non-transmissive material used for the wall 170 as well as the angle of inclination 308 with respect to the lateral side 307 of the dam 301. For instance, when the angle of inclination 308 is suitably selected in a range from about 30 to 85 degrees, the beam angle will range from 140 to 110 degrees.

Figure 11:
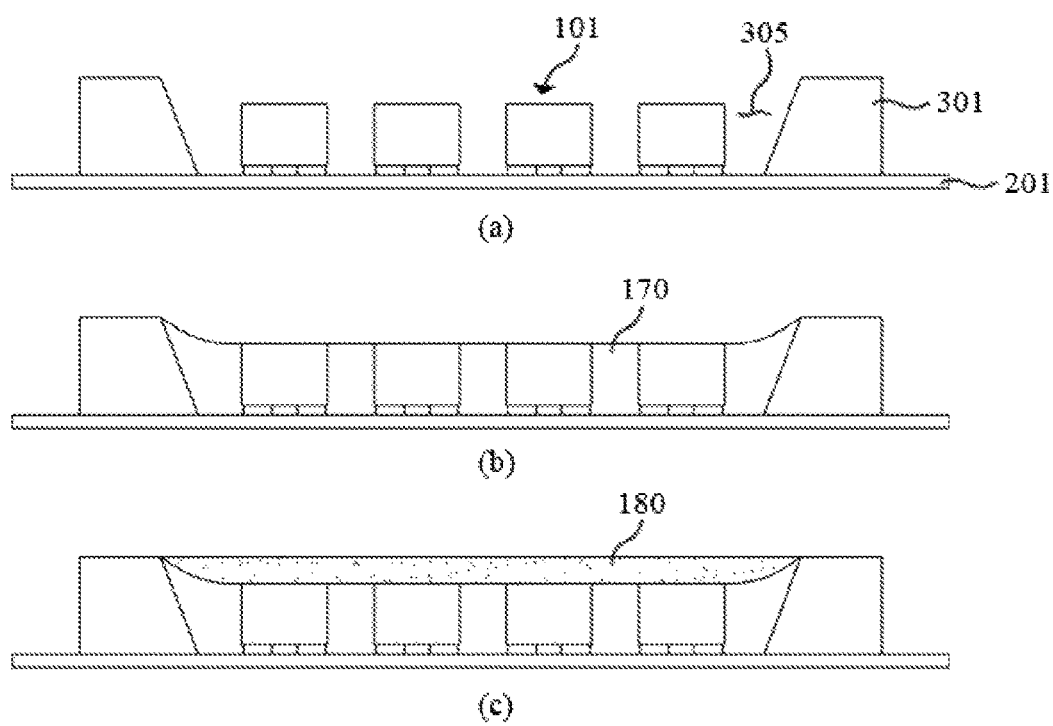
FIG. 11 is a schematic illustration for describing another exemplary embodiment of a method for manufacturing a semiconductor light emitting device according to the present disclosure.

FIG. 11 is a schematic illustration for describing another exemplary embodiment of a method for manufacturing a semiconductor light emitting device according to the present disclosure. The semiconductor light emitting device thus obtained according to the present disclosure not only has advantages similar to those of a CSP type semiconductor device, but it can also be manufactured to a larger size package as a single opening 305 in the dam 301 has a plurality of semiconductor light emitting chips 101 therein. First, a plurality of semiconductor light emitting chips 101 is provided to an exposed portion of the base 201 through the opening 305 in the dam 301, and a non-transmissive material is fed to form a wall 170. The non-transmissive material spreads and flows between the lateral sides of neighboring semiconductor light emitting chips 101, and the upper end 173 of the wall 170 between the semiconductor light emitting chips 101 is made flat. The non-transmissive material arises along the lateral side 307 of the dam 301, caused by surface tension effects, and the outer upper end 173 of the resulting wall 170 is formed into a shape as described above. The encapsulant 180 is formed in the bowl 135 such that it covers upper sides of the plurality of semiconductor light emitting parts 105 exposed from the wall 170. These semiconductor light emitting chips 101 may be identical chips, or different chips which emit different colors (e.g., an NUV chip, a blue chip, a green chip, a red chip, etc.). Alternatively, barriers 170 for dividing the region of the bowl 135 may be installed between neighboring semiconductor light emitting chips 101, and encapsulants 180 with different phosphors may be formed in the respective sections of the bowl 135 divided by the barriers 170.

Figure 12:
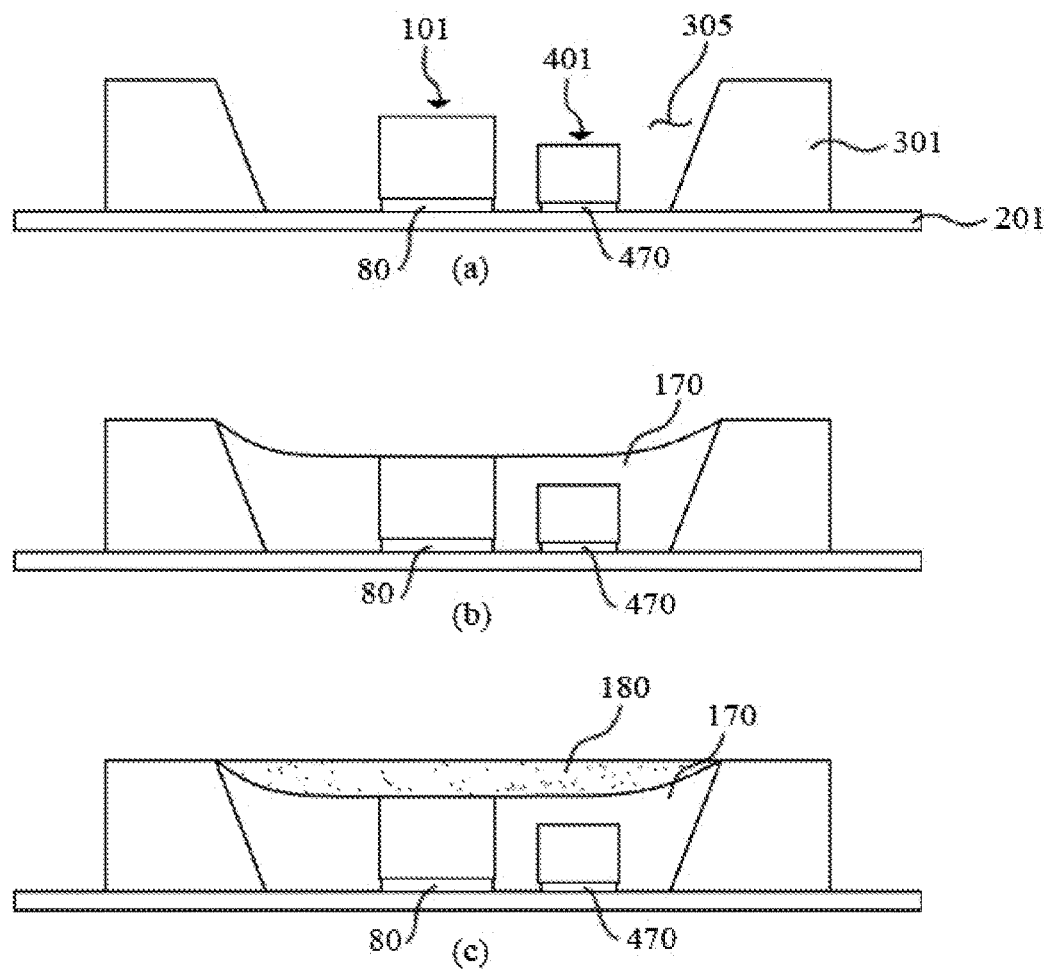
FIG. 12 is a schematic illustration for describing another exemplary embodiment of a method for manufacturing a semiconductor light emitting device according to the present disclosure.

FIG. 12 is a schematic illustration for describing another exemplary embodiment of a method for manufacturing a semiconductor light emitting device, in particular, a semiconductor light emitting device having a functional element 401, according to the present disclosure. First, as shown in FIG. 12a, in step of placing a dam 301 and a semiconductor light emitting chip 101 onto a base 201, not only the semiconductor light emitting chip 101 but the functional element 101 is also placed on an exposed portion of the base 201 through the opening 305. The functional element 401 is an element associated with the functions of the semiconductor light emitting chip 101. In this exemplary embodiment, the functional element 401 is an element for protecting the semiconductor light emitting part 105 from damage, i.e. a protecting element (e.g., Zener diode) for protecting the semiconductor light emitting part 105 from ESD (Electro-Static Discharge) and/or EOS (Electrical Over-Stress). Alternatively, the functional element 401 may be an element functionally associated with light from the semiconductor light emitting part 105. To improve the formation of an electrical connection structure, the functional element 401 may be an element of the same type as the semiconductor light emitting part 105. By way of example, the functional element 401 in this exemplary embodiment is a flip chip element having two electrical terminals 480, 470 (see FIG. 16c) that are exposed towards the base 201.

A non-transmissive material is then fed to form a wall 170, as shown in FIG. 12b. At least the lateral sides of the functional element 401 are surrounded with the wall 170. Preferably, the upper side of the functional element 401 is also covered with the wall 170. In this way, light entering an encapsulant 180 from the semiconductor light emitting chip 101 is prevented from being absorbed and lost in the functional element 401. Moreover, the functional element 401 is protected by the wall 170. Next, the encapsulant 180 is formed in a bowl 135 defined by the upper end 173 of the wall 170 and the semiconductor light emitting part 105.

Figure 13:
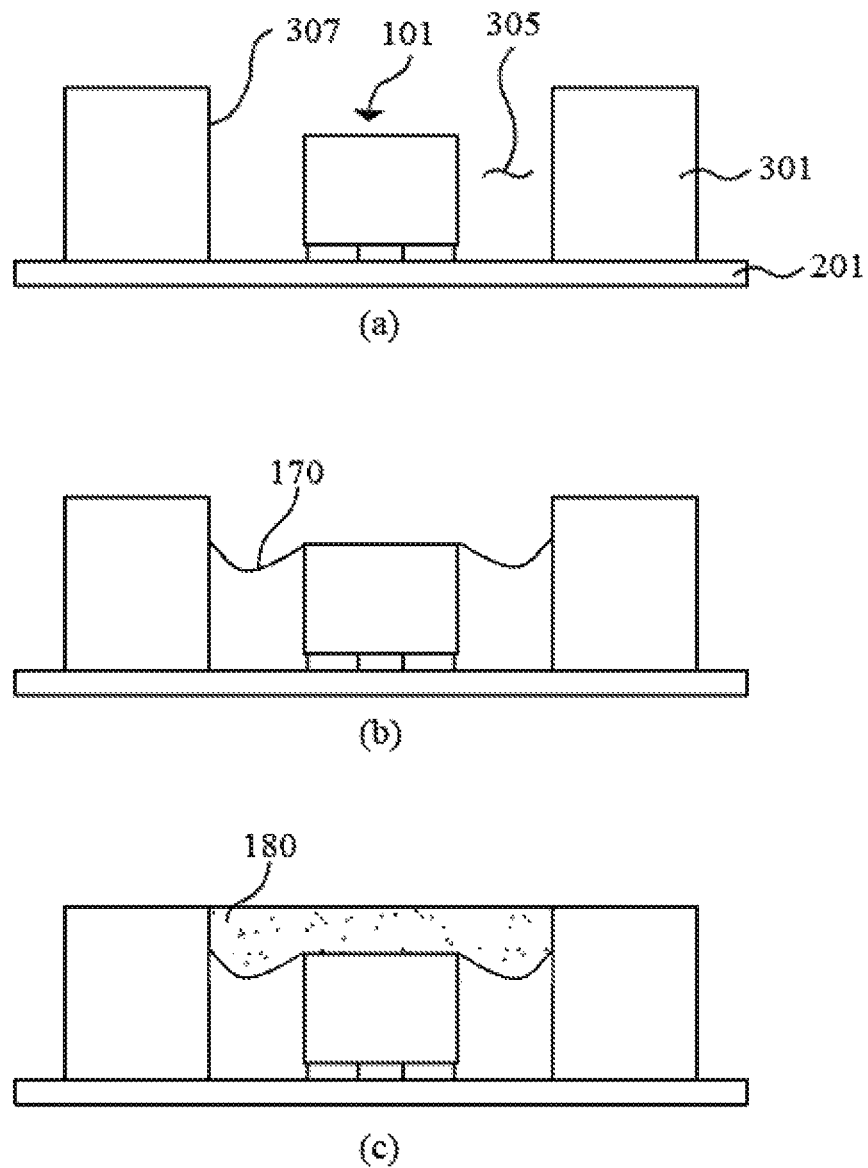
FIG. 13 is a schematic illustration for describing another exemplary embodiment of a method for manufacturing a semiconductor light emitting device according to the present disclosure.

FIG. 13 is a schematic illustration for describing another exemplary embodiment of a method for manufacturing a semiconductor light emitting device according to the present disclosure. If the angle of inclination 308 of the lateral side 307 of the dam 301 is a right angle, a non-transmissive material for example will not arise much by surface tension effects, but if the lateral side 307 of the dam 301 is oblique, the non-transmissive material for example will arise a lot more by surface tension effects. If required, the angle of inclination 308 of the lateral side 307 of the dam 301 placed in the opening 305 can be almost a right angle, as shown in FIG. 13a. Once the chip is placed on the base 201, a non-transmissive material is fed, and the lateral side 307 of the dam 301 and the lateral side of the semiconductor light emitting chip 101 pull up the non-transmissive material by surface tension effects as shown in FIG. 13b. As a result, the upper end 173 of the wall 170 will be curved concave inward as in FIG. 13b. Compared with the upper end 173 of the wall 170 in FIG. 7 formed against the inclined lateral side 307 of the dam 301, the upper end 173 of the wall 170 in FIG. 13 can be formed higher, especially at the lateral side 307 of the dam 301. Needless to say, knowing that the surface tension effects vary depending on the nature of a non-transmissive material used, in one example, the upper end 173 of the wall 170 may be almost flat, and hardly incurved under a very week surface tension.

Referring next to FIG. 13c, an encapsulant 180 is formed in the bowl 135. In this case, the bowl 135 corresponds to a space defined by the lateral side 307 of the dam 301, the upper end 173 of the encapsulant 180, and the upper end 173 of the semiconductor light emitting part 105 being connected together.

Figure 14:
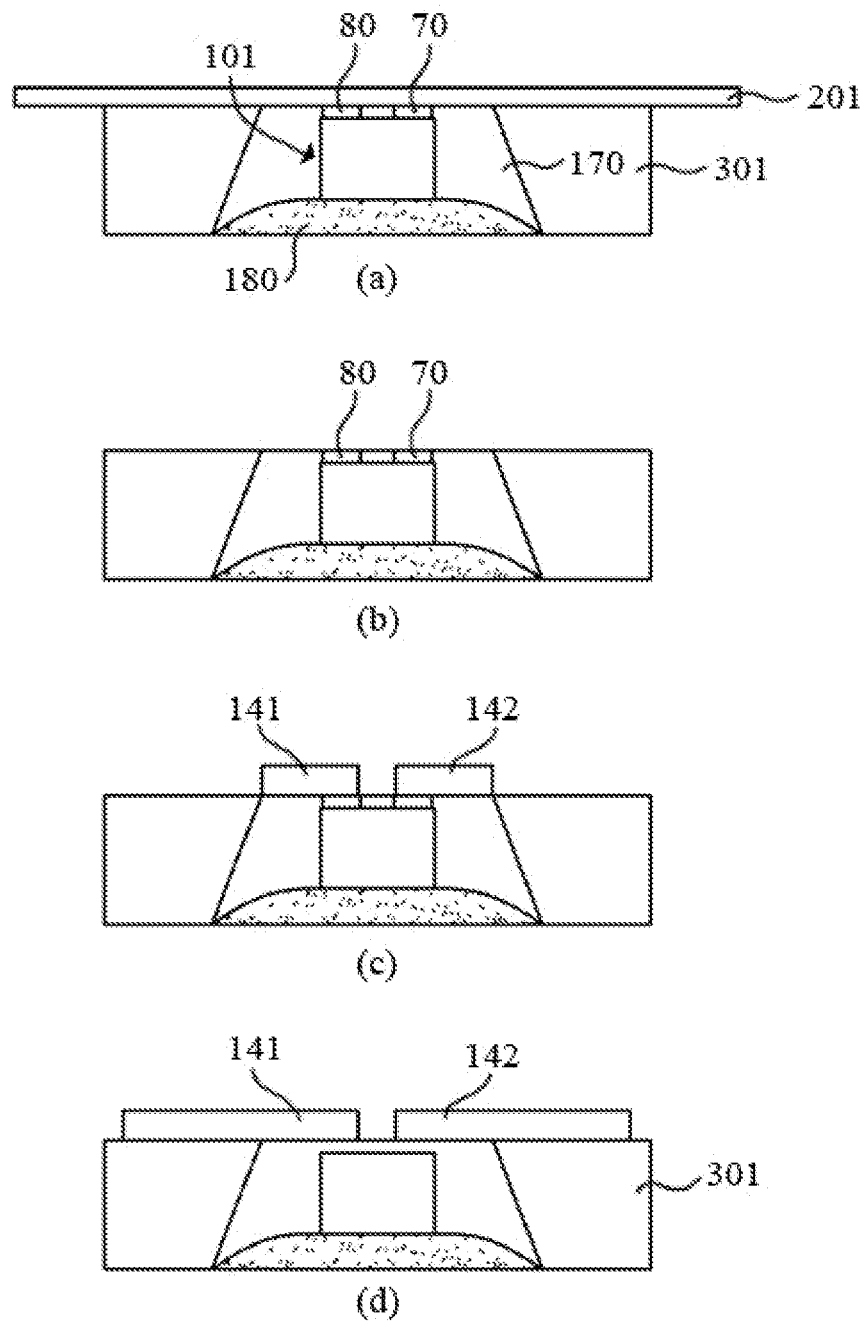
FIG. 14 is a schematic illustration for describing another exemplary embodiment of a method for manufacturing a semiconductor light emitting device according to the present disclosure.

FIG. 14 is a schematic illustration for describing another exemplary embodiment of a method for manufacturing a semiconductor light emitting device according to the present disclosure. This method for manufacturing a semiconductor light emitting device further includes forming a first conductive part 141 and a second conductive part 142, following the formation of a semiconductor light emitting chip 101, a wall 170 and an encapsulant 180. Here, the semiconductor light emitting chip 101, the wall 170 and the encapsulant 180 can be formed according to the exemplary methods described in FIG. 7 to FIG. 13. In this exemplary embodiment, the semiconductor light emitting 101 is a flip chip including first and second electrodes 80 and 70, facing the base 201. Following the formation of the encapsulant 180, the base 201 is separated from the dam 301 and the wall 170, as shown in FIG. 14a and FIG. 14b. The base 201 may be a flexible tape or film, or a rigid plate.

Although the first electrode 80 and the second electrode 70 are not covered with the wall 170 as they are bonded to the base 201, an optional process such as, for example, plasma etching, mechanical brushing or polishing may be performed additionally after the base 201 is removed as shown in FIG. 14*b*, to expose more of the electrodes 80, 70 or to remove contamination.

Next, as shown in FIG. 14*c*, the first conductive part 141 and the second conductive part 142 are formed such that they come into contact with those exposed first and second electrodes 80 and 70, respectively, after the base 201 is removed. For instance, this can be accomplished by depositing a metal via a shadow mask, or metal plating. The first conductive part 141 comes in contact with the first electrode 80, and the second conductive part 142 comes in contact with the second electrode 70. In an alternative example, the first and second conductive parts 141 and 142 have larger areas than those of the first and second electrodes 80 and 70, and are formed on the bottom of the wall 170, as shown in FIG. 14*c*. In another alternative example, the first and second conductive parts 141 and 142 can be extended down to the bottom side of the dam 301, as shown in FIG. 14*c*. The first conductive part 141 and the second conductive part 142 are advantageously used for increasing an electrical contact area, improving a bonding strength with an external electrode, and enlarging a heat protection area.

Figure 15:
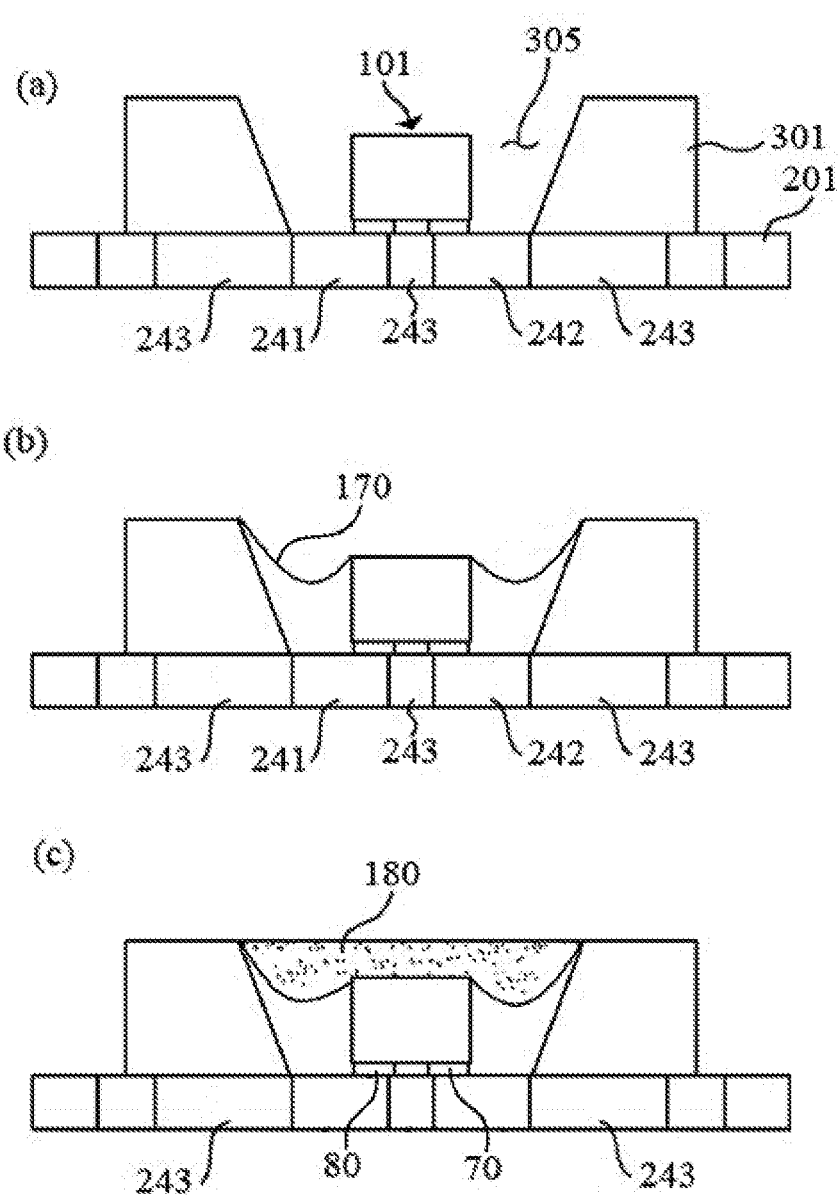
FIG. 15 is a schematic illustration for describing another exemplary embodiment of a method for manufacturing a semiconductor light emitting device according to the present disclosure.

FIG. 15 is a schematic illustration for describing another exemplary embodiment of a method for manufacturing a semiconductor light emitting device according to the present disclosure. In this exemplary embodiment, a first conductive part 241, a second conductive part 242, and an insulating part 243 interposed between them are formed on the base 201. The first conductive part 241, the insulating part 243, and the second conductive part 242 may be formed repeatedly in this sequence. The first conductive part 241, the insulating part 243, and the second conductive part 242 are exposed to the opening 305 in the dam 301, and the semiconductor light emitting chip 101 is placed such that the first electrode 80 of the semiconductor light emitting chip 101 comes in contact with the first conductive part 241, and the second electrode 70 of the semiconductor light emitting chip 101 comes in contact with the second conductive part 242, as shown in FIG. 15*a*. After that, a wall 170 is formed, and an encapsulant 180 is formed next. According to this semiconductor light emitting device and the method for manufacturing the same, the base 201 has an electrical connection structure, which eliminates the need for a process of forming the first and second conductive parts 141 and 142 described in FIG. 14.

To produce such a plate-type base 201, a stack of plural conductive plates (e.g.: Al/Cu/Al) is prepared by bonding those conductive plates with an insulating material such as an insulating adhesive (e.g., epoxy) and stacking them multiple times repeatedly. The stack is then cut (e.g., wire cutting) to obtain a plate-type base 201 as shown in FIG. 15. Depending on a cutting method used, the resulting plate may have a long strip shape or a broad shape like a chessboard. The widths of the first conductive part 241, second conductive part 242 and insulating part 243 may be adjusted by varying the thicknesses of the conductive plate and insulating adhesive.

Figure 16:
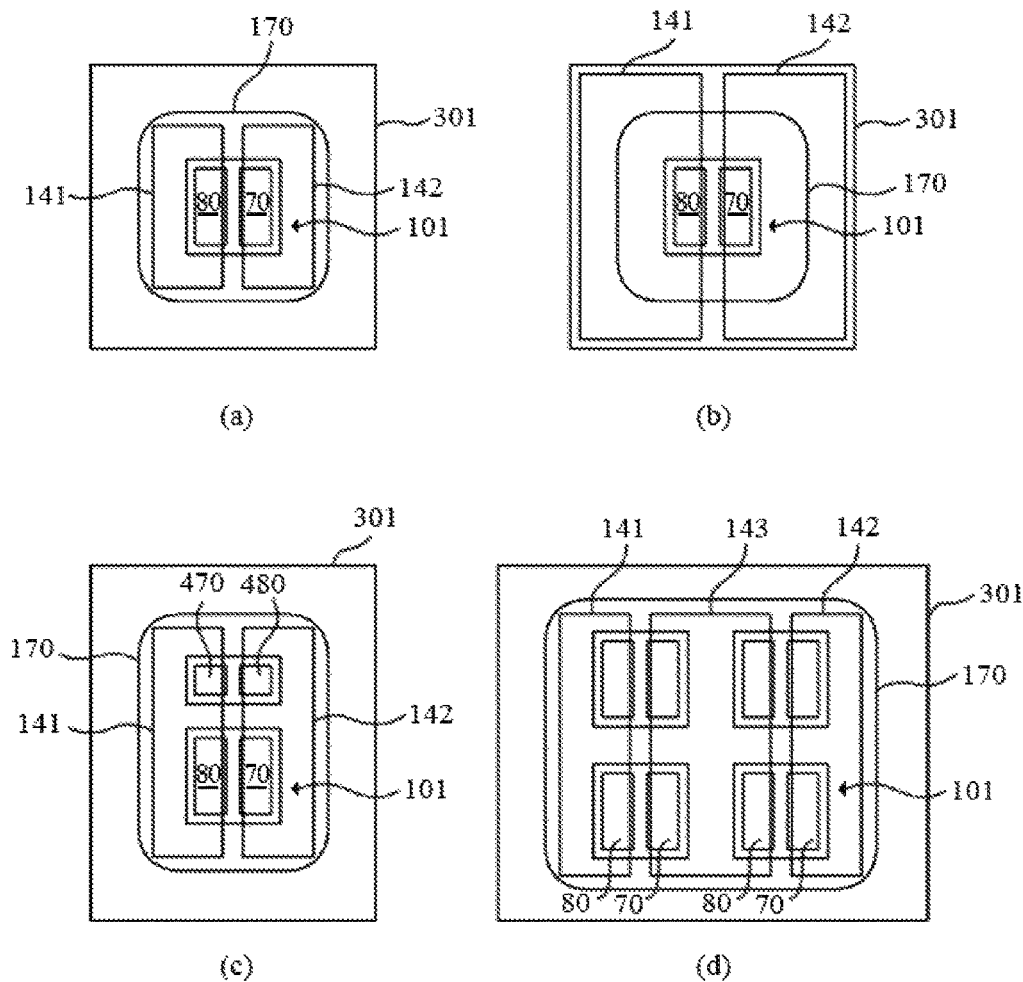
FIG. 16 is a schematic illustration for describing exemplary first and second conductive parts.

FIG. 16 is a schematic illustration for describing exemplary first and second conductive parts 141 and 142. When seen in a bottom view, the first conductive part 141 and the second conductive part 142 may stay within the bottom face of a wall 170, positioned a distance away from each other, while coming in contact with a first electrode 80 and a second electrode 70, respectively. Alternatively, the first conductive part 141 and the second conductive part may be formed such that they are extended beyond the bottom face of the wall 170 until they reach the bottom face of a dam 301, as shown in FIG. 16*b*. This work better if the dam 301 is composed of a non-metallic material.

Moreover, as shown in FIG. 16*c*, a semiconductor light emitting chip 101 as well as a functional element 401 are provided, and a first conductive part 141 serves to electrically connect a first electrode 80 of the semiconductor light emitting chip 101 with one electrode 470 out of two electrodes in a protecting element, and a second conductive part 142 serves to electrically connect a second electrode 70 of the semiconductor light emitting chip 101 with the other electrode 480 out of those two electrodes in the protecting element. When the functional element 401 is a Zener diode, the semiconductor light emitting chip 101 and the Zener diode can be connected in reverse parallel fashion. Alternatively, when a plurality of semiconductor light emitting chips 101 is arranged in a single opening 305, these semiconductor light emitting chips may be electrically connected in series and/or in parallel by a first conductive part 141, a second conductive part 142, and a third conductive part 143. The first conductive part 141 is connected to two, first electrodes 80 of the two semiconductor light emitting chips 101 on the left hand side, and the second conductive part 142 is connected to two, second electrodes 70 of the two semiconductor light emitting chips 101 on the right hand side. The third conductive part 143 connects the two, second electrodes 70 of the two semiconductor light emitting chips 101 on the left hand side with the two, first electrodes 80 of the two semiconductor light emitting chips 101 on the right hand side. In this manner, four semiconductor light emitting chips 101 are connected in parallel and in series. These connection schemes may be changed by modifying the arrangement of semiconductor light emitting chips 101 and the configuration of conductive parts.

Figure 17:
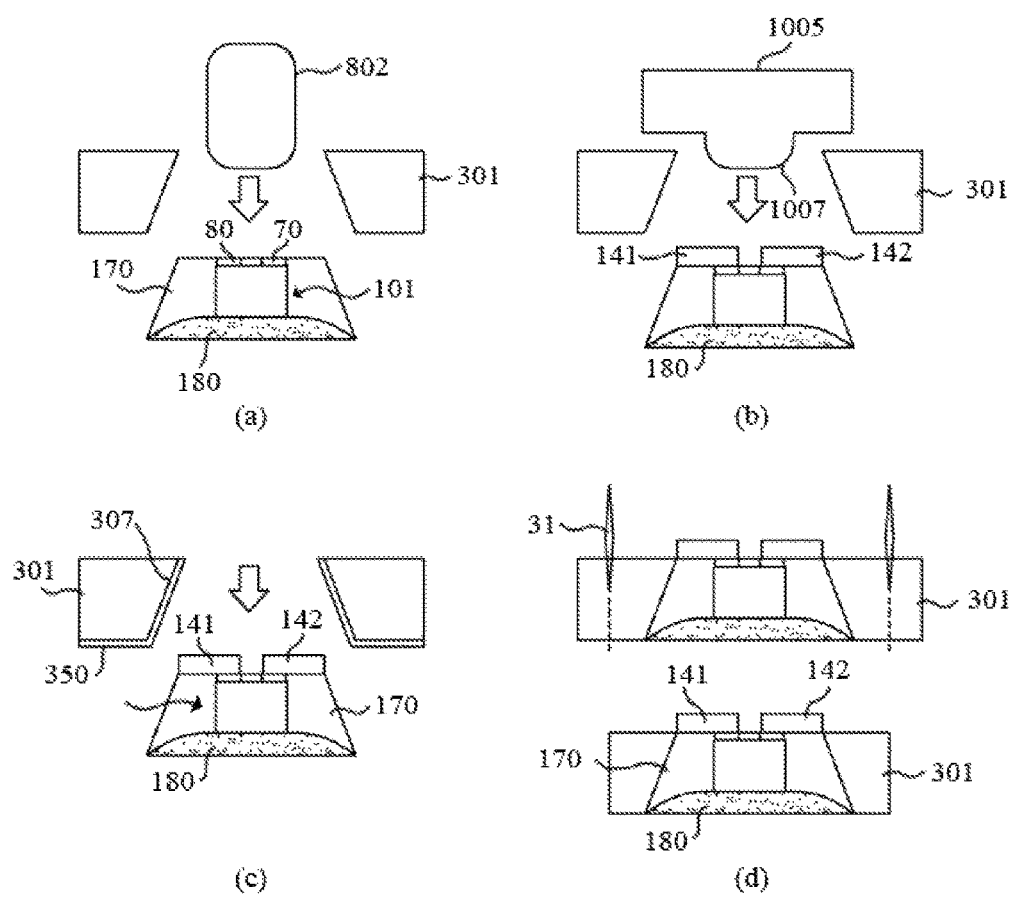
FIG. 17 is a schematic illustration for describing other exemplary embodiments of a method for manufacturing a semiconductor light emitting device according to the present disclosure.

FIG. 17 is a schematic illustration for describing other exemplary embodiments of a method for manufacturing a semiconductor light emitting device according to the present disclosure. The method for manufacturing a semiconductor light emitting device includes a process of forming an assembly of a semiconductor light emitting chip 101, a wall 170, an encapsulant 180, a first conductive part 141, and a second conductive part 142, followed by a process of separating the semiconductor light emitting device from a dam 301. The processes described in FIG. 7 to FIG. 14, and FIG. 16 may be applied to form the assembly. The semiconductor light emitting device may not include the first and second conductive parts 141 and 142 and may be separated from the dam 301, as shown in FIG. 17*a*. The semiconductor light emitting device is separated from the dam 301 as it is pushed away by a bar as shown in FIG. 17*a*, or by a plate 1005 having an embossed pattern 1007 as shown in FIG. 17*b*.

To facilitate the separation process, a bonding strength control film 350 or a release coating layer may be formed on the lateral side 307 of the dam 301. The dam 301 can be composed of any of plastics and metals, and the wall 170 can be composed of any of silicon-based or epoxy-based materials. Therefore, a material for the release coating layer should preferably present releasability or lubricating properties during bonding between the metal or plastics and the silicon-based or epoxy-based material, and have heat resistance and electrical insulation properties. Such release materials are commercially available, and any suitable one of those various products can be employed. In one example, a spraying process can be incorporated, and the release material may be in aerosol form. Meanwhile, the bonding strength control film 350 may also serve as a control film for controlling a rising degree of a non-transmissive material by surface tension effects during a process of forming the wall 170. Therefore, in an alternative example, the aforementioned control film is formed on the lateral side 307 of the dam 301, which is composed of a non-conductive material, and the first and second conductive parts 141 and 142 are extended down to the bottom face of the dam 301 as shown in FIG. 16d.

Further, in order to obtain a semiconductor light emitting device, the dam 301 is then cut out and leaves the cut dam 301 on the outer lateral side 172 of the wall 170 as shown in FIG. 17d. By cutting the dam 301 in this way, the heat protection area can be increased, and handling convenience of the semiconductor light emitting device thus manufactured can be enhanced.

Figure 18:
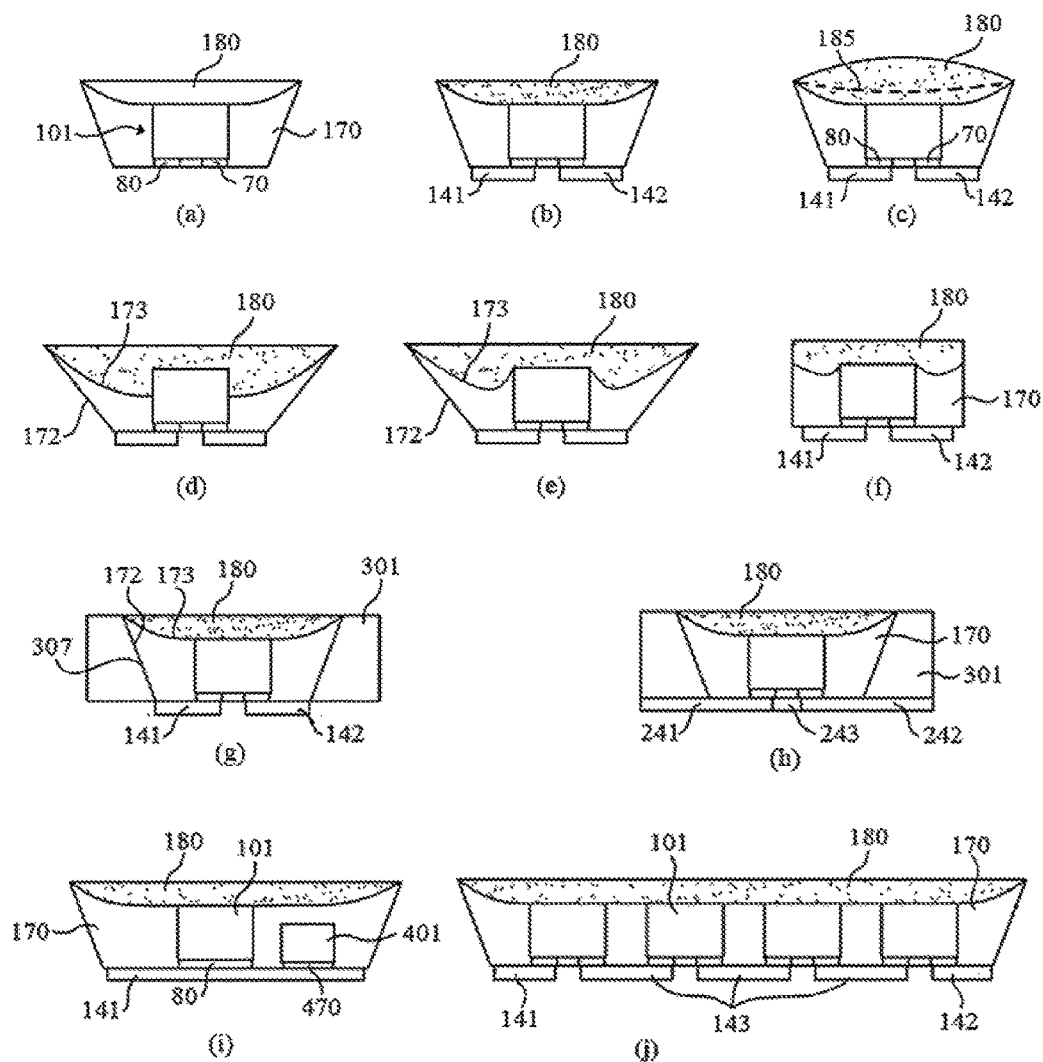
FIG. 18 is a schematic illustration for describing exemplary embodiments of a semiconductor light emitting device according to the present disclosure.

FIG. 18 is a schematic illustration for describing exemplary embodiments of a semiconductor light emitting device according to the present disclosure. Semiconductor light emitting devices shown in FIG. 18 can be manufactured according to the methods described in FIG. 7 to FIG. 17. Each of the semiconductor light emitting devices includes a semiconductor light emitting chip 101, a wall 170, and an encapsulant 180. The semiconductor light emitting chip 101 has a semiconductor light emitting part 105 for generating light by electron-hole recombination, and at least one electrode 80, 70 electrically connected to the semiconductor light emitting part 105. In this exemplary embodiment, the semiconductor light emitting chip 101 is a flip chip including a first electrode 80 and a second electrode 70, with at least one of the electrodes 80 and 70 being exposed towards the opposite side of the encapsulant 180 with respect to the semiconductor light emitting part 105. Further, the semiconductor light emitting device may include a first conductive part 141 formed on the lower end of the wall 170 to come in contact with the first electrode 80, and a second conductive part 142 formed on the lower end of the wall 170 to come in contact with the second electrode 70, with the second conductive part 142 being positioned a distance away from the first conductive part 141.

The wall 170 is placed on the lateral side of the semiconductor light emitting part 105, and the upper end 173 of the wall 170 has an elevated shape caused by surface tension effects. The wall 170 is preferably composed of a non-transmissive material, and in this case it can be a reflector. As shown in some exemplary embodiments of FIG. 18, the upper end 173 of the wall 170 can have an outer edge being higher than the lateral side of the semiconductor light emitting part 105. The outer lateral side 172 of the wall 170 is inclined in such a way that it is farther from the semiconductor light emitting part 105 at the upper end 173 than at the lower end of the wall 170. As described above, the upper end 173 of the wall 170 may have a different concavity, depending on an amount or viscosity of a resin or non-transmissive material used. For instance, in an exemplary embodiment shown in FIG. 18e, the upper end 173 of the wall 170 is curved inward deeper than the upper ends 173 of the walls 170 in those exemplary embodiments shown in FIG. 18a and FIG. 18b. Alternatively, the upper end 173 of the wall 170 may reach all the way up to the top of the lateral side of the semiconductor light emitting chip 101 as in an exemplary embodiment shown in FIG. 18e. Still in another alternative exemplary embodiment, the upper end 173 of the wall 170 may not reach all the way up to the top of the lateral side of the semiconductor light emitting chip 101 as shown in FIG. 18d.

The encapsulant 180 is formed in a bowl 135 (see FIG. 7b) defined by the upper end 173 of the wall 170 and the semiconductor light emitting part 105, and allows light from the semiconductor light emitting part 105 to transmit therethrough. As in FIG. 18a, the encapsulant 180 may be composed of transparent silicon, or contain a phosphor. The top face of the encapsulant may be flat, or it may be elevated or recessed slightly as indicated by dotted lines 185 as shown in FIG. 18c. The type of a phosphor to be used is determined by a desired color of light generated from the semiconductor light emitting part 105 and by light emitted from the semiconductor light emitting chip. For instance, if the semiconductor light emitting chip 101 emits blue light, a yellow phosphor may be used to obtain white light.

In another exemplary embodiment, a semiconductor light emitting device may further include a dam 301 as shown in FIG. 18g and FIG. 18h. The dam 301 is placed on the opposite of the semiconductor light emitting chip 101 with respect to the wall 170, and has a lateral side 307 (inclined side) surrounding the outer lateral side 172 of the wall 170. The upper end 173 of the wall 170 has risen along the inclined side 307 of the dam 301 caused by surface tension effects.

In another exemplary embodiment, as shown in FIG. 18i, a semiconductor light emitting device includes a flip chip-type functional element 401 having two electrical terminals 480 and 470 (see FIG. 16c), in which the functional element 401 is at least partially surrounded by the wall 170 such that the two electrical terminals 480 and 470 thereof are exposed towards the first and second electrodes 80 and 70.

Referring now to FIG. 18j, a semiconductor light emitting device in this exemplary embodiment may include a plurality of semiconductor light emitting chips 101, and has a wall 170 adapted to surround lateral sides of the plurality of semiconductor light emitting chips 101 and an encapsulant 180 adapted to cover those exposed semiconductor light emitting chips 101 from the wall 170.

Figure 19:
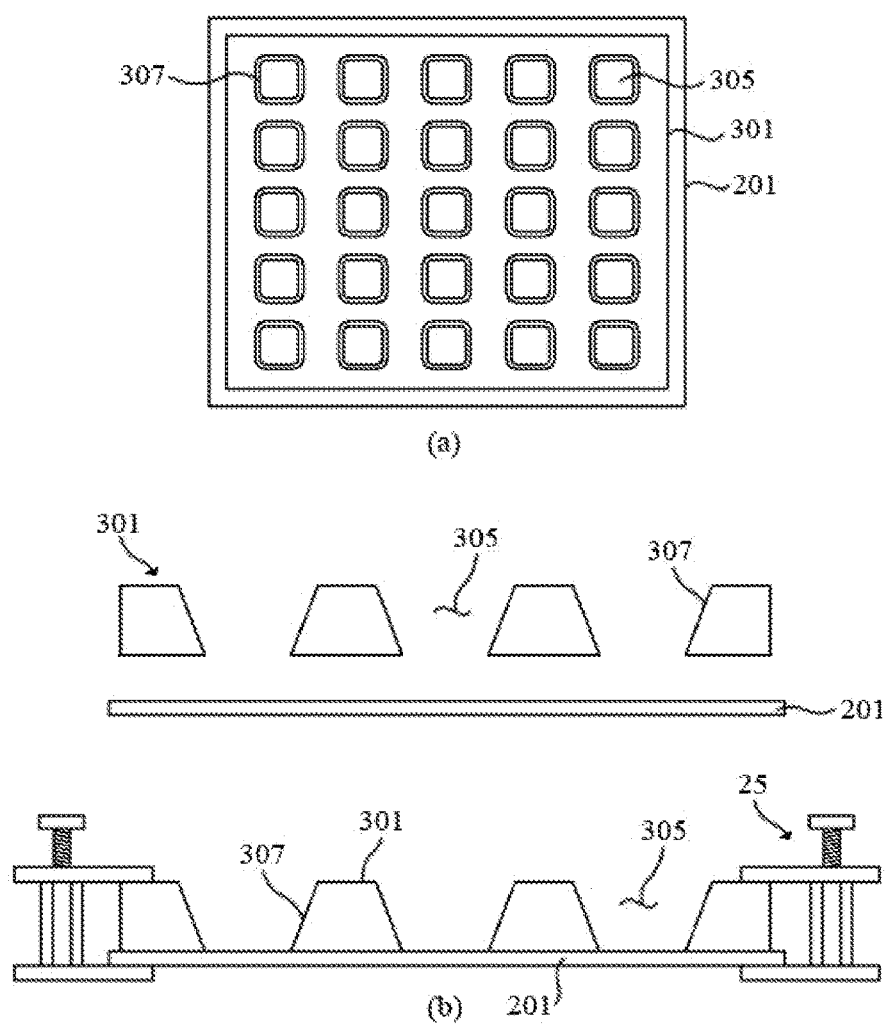
FIG. 19 to FIG. 23 are schematic illustrations for describing other exemplary embodiments of a method for manufacturing a semiconductor light emitting device according to the present disclosure.
Figure 20:
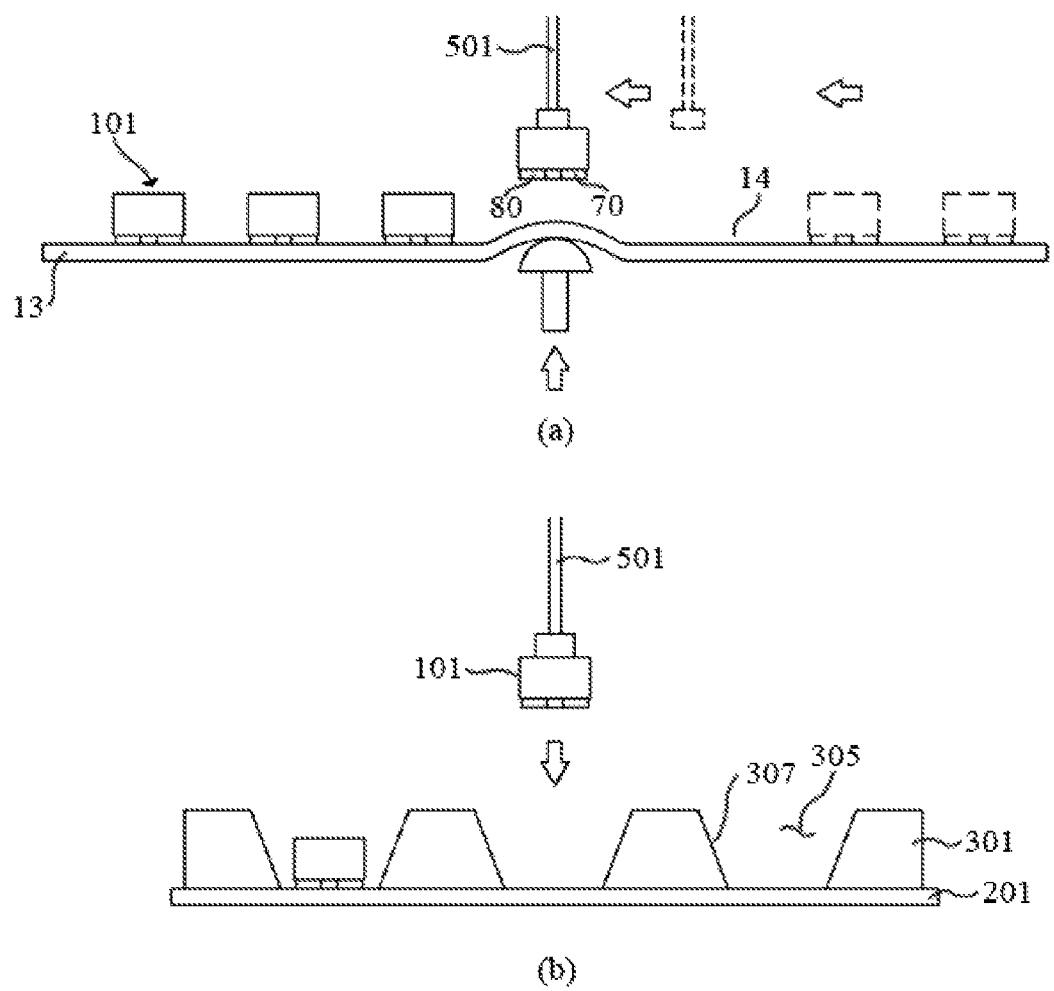

FIG. 19 to FIG. 23 are schematic illustrations for describing an exemplary embodiment of a method for manufacturing a semiconductor light emitting device according to the present disclosure. Referring first to 19, a dam 301 or mask having a plurality of openings 305 formed therein is provided onto a base 201. Next, as shown in FIG. 20, semiconductor light emitting chips 101 are placed on exposed portions of the base 201 through the openings 305, respectively, with a device carrier 501 adapted to recognize the shape, pattern or boundaries of the mask 301 so as to calibrate the position and angle of a device to be placed. A non-transmissive material is then fed between the lateral side 307 of the dam 301 and the lateral side of the semiconductor light emitting chip 101 to form a wall 170, as shown in FIG. 23a and FIG. 23b.

Figure 1:
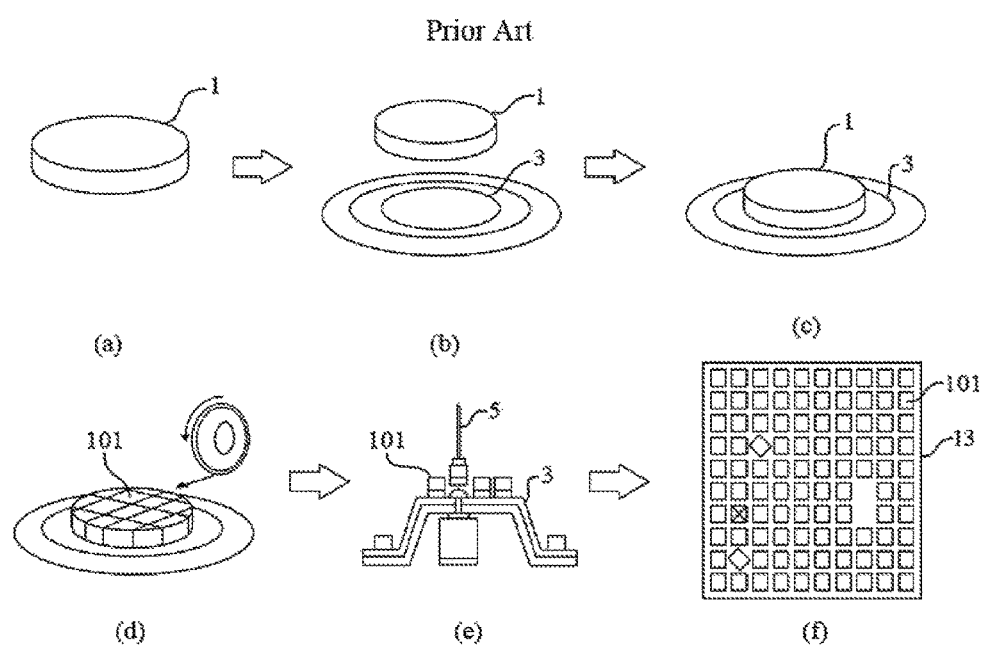
FIG. 1 is a schematic illustration showing an exemplary process of fabricating a semiconductor light emitting chip from a wafer.
Figure 2:
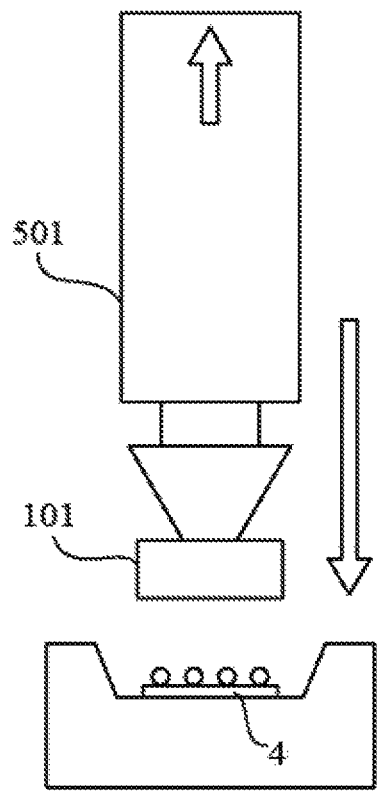
FIG. 2 is a schematic illustration showing an exemplary process of manufacturing a semiconductor light emitting device package with semiconductor light emitting chips.
Figure 2:
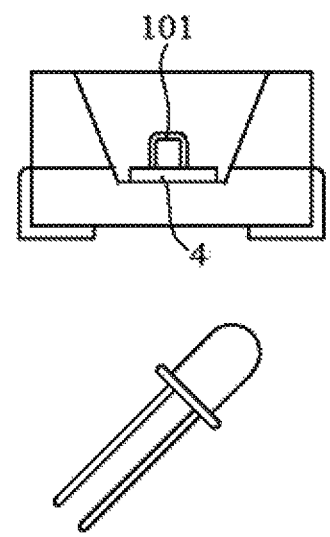
Figure 3:
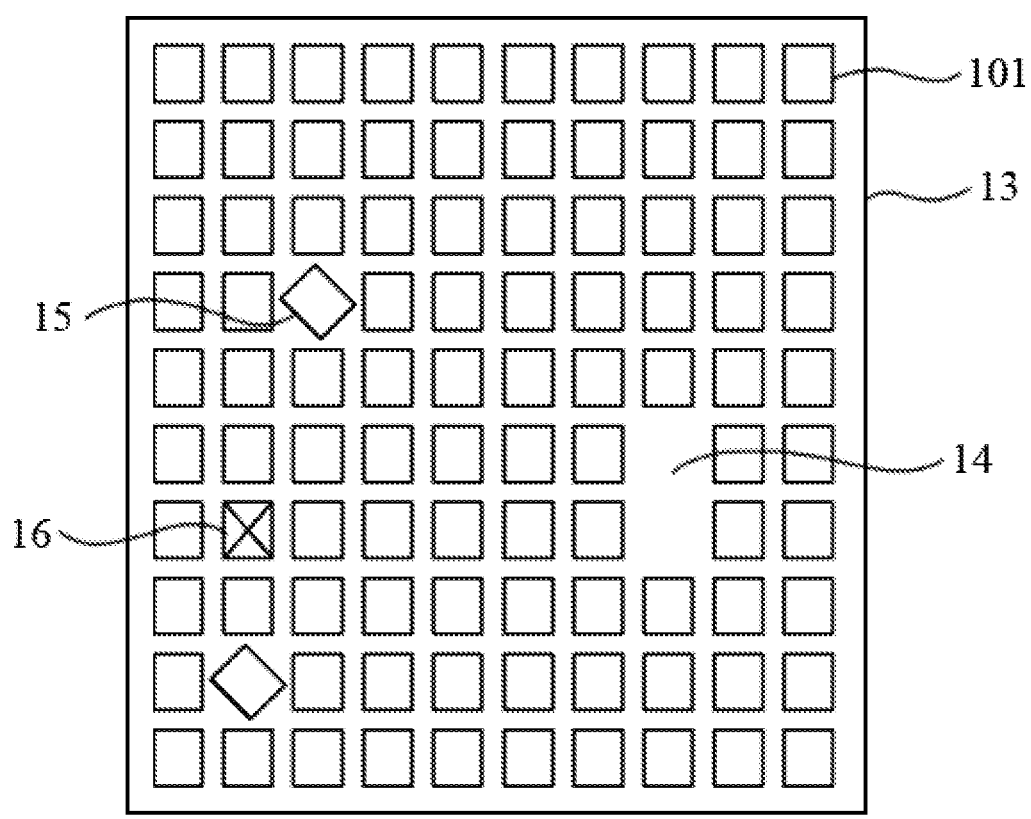
FIG. 3 is a schematic illustration showing an example of semiconductor light emitting chips arrayed on a tape by means of a sorter.

In this embodiment, the dam 301 is provided on the base 201 before the semiconductor light emitting chips 101 are placed on the base 201. The dam 301 may be seen as a pattern for the device carrier 501 to calibrate the position or angle of a semiconductor light emitting chip 101 to be placed, and it may also serve as a dam of the wall 170. Since the dam 301 and the openings 305 constitute a frame designed to be very accurate and exact in manner, they provide high-precision alignment of semiconductor light emitting chips 101, as compared with the case where devices are arranged on a dam 301—free base 201 or flat tape 13 (see FIG. 3) by means of a sorter (e.g., 5 in FIG. 2) according to a given instruction on each occasion. Therefore, defects due to inaccurate alignment are reduced. Moreover, when a semiconductor light emitting chip 101 being adhered to the tape 13 is provided to the device carrier 501 (see FIG. 20a), the semiconductor light emitting chip may not necessarily be made to perfectly fit in the required dimensions as the device carrier 501 itself can recognize a vacancy 14 (see FIG. 20a) without a semiconductor light emitting chip 101 to carry another semiconductor light emitting chip 101, and correct any skew angle of the semiconductor light emitting chip 101 before placing it on the base 201. Accordingly, this reduces the burden of providing semiconductor light emitting chips 101 to the device carrier 501 in a perfectly precise manner.

While flip chips are suitable for those semiconductor light emitting chips 101 in this embodiment, lateral chips or vertical chips may also be used. As for a flip chip light emitting device, the semiconductor light emitting chip 101 has two electrodes 80, 70 (see FIG. 21) that are exposed from the encapsulant.

Each process will now be elaborated as follows.

As shown in FIG. 19, a dam 301 is provided on a base 201. The base 201 may be either a rigid metallic plate or non-metallic plate or a flexible film or tape. The present disclosure is not particularly restricted to certain metallic plates, and Al, Cu, Ag, Cu—Al alloys, Cu—Ag alloys, Cu—Au alloys, SUS (stainless steel) or the like may be used as the metallic plate. A plated metallic plate can also be used. The non-metallic plate may be made of plastics in a wide range of colors or light reflectances. In addition, the present disclosure is not particularly restricted to certain films or tapes, and any sticky or adhesive film or tape having heat resistant properties is desired. For example, a heat-resistant tape or a blue tape in a wide range of colors or light reflectances may be used.

Therefore, the embodiment described above is advantageous in that the base 201 on which semiconductor light emitting chips 101 are aligned does not have to be a semiconductor substrate or other more expensive substrates. Further, the base 201 does not need to go through an additional patterning process because the dam 301 serves as a guide for alignment of the semiconductor light emitting chips 101.

The dam 301 may be a plastic, metallic or film formed on the surface, and has a plurality of openings 305. While the dam 301 may be made of the same material as the base selected from those mentioned above, it is preferentially made of a material that is sufficiently firm or hard to maintain the shape of the dam 301 or openings 305 and that is effective for avoiding cracks or splits. In particular, as will be described later, the dam 301 and the base 201 are preferentially different from each other in terms of at least one of material, color and light reflectance, thereby assisting the device carrier in its recognizing a pattern of the dam 301.

In this embodiment, the base 201 and the dam 301 abut each other by an externally applied force. For example, as shown in FIG. 19b, a clamp 401 may be used to make the base 201 and the dam 301 abut each other. As such, this embodiment presents a simple and convenient way of bringing the base 201 and the dam 301 into contact with each other and of separating the dam 301 from the base 201 by loosening the clamp 401. The base 201 itself may be an adhesive or sticky tape, or optionally, an adhesive material may be inserted between the base 201 and the dam 301. For instance, the adhesive material can be selected from a wide range of materials including a conductive paste, an insulating paste, a polymeric adhesive or the like, and is not particularly limited thereto. However, those materials which lose their adhesion at a certain temperature range are avoided because the base 201 and the dam 301 could be easily separated from each other at the temperature range.

The plurality of openings 305 formed in the dam 301 is arrayed in columns and rows, for example. The top face of the base 201 is exposed through the openings 305. The number of openings 305 and their array format can vary according to needs. The openings 305 may have a matching shape with the semiconductor light emitting chip 101 or a different shape from the semiconductor light emitting chips 101. In this exemplary embodiment, the opening 305 has rounded corners.

FIG. 20 is a schematic illustration for describing an exemplary process of placing semiconductor light emitting chips 101 in exposed portions of the base 201 through the openings 305, in which a device carrier 501 picks up each semiconductor light emitting chip 101 on a fixing component 13 (e.g., a tape) and then places it on an exposed portion of the base 201 through a corresponding opening 305. Prior to this process, a device aligner (e.g., a sorter) may put a plurality of semiconductor light emitting chips 101 on the tape 13, as in the embodiment shown in FIG. 3. Referring to FIG. 20a, when a pin or rod (bar) strikes a semiconductor light emitting chip 101 from the bottom of the tape 13, the semiconductor light emitting chip 101 comes off the tape 13, and at this moment, the device carrier 501 can catch the semiconductor light emitting chip 101 by electric suction or vacuum suction. Referring to FIG. 20b, the device carrier 501 hovers above the base 201 to place semiconductor light emitting chips 101 into their corresponding openings 305. The semiconductor light emitting chip 101 is placed in such a manner that its two electrodes 80, 70 face the top face of the base 201. Therefore, those two electrodes 80, 70 are not covered with an wall 170, which will be described later. Similar to a die bonder for example, the device carrier 501 recognizes patterns or shapes. Regardless of the name of an instrument used, any instrument capable of calibrating a target position or angle of an object can be employed.

Figure 21:
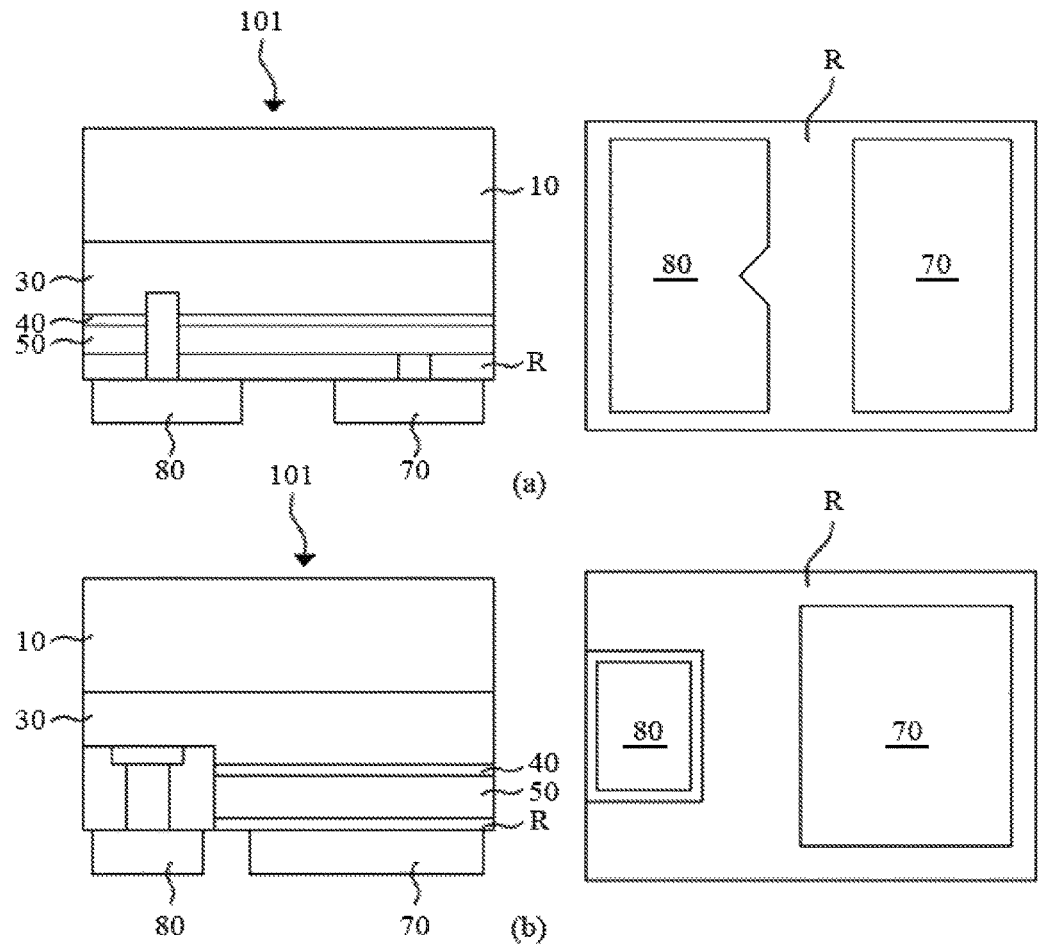

FIG. 21 is a schematic illustrating for describing different embodiments of a semiconductor light emitting chip. In these embodiments, the semiconductor light emitting chip 101 is a flip chip device, including a growth substrate 10, a plurality of semiconductor layers 30, 40, 50, a light reflective layer R, and two electrodes 80, 70. In the case of Group III-nitride semiconductor light emitting devices, for example, the growth substrate 10, which may be eventually removed, is made primarily of sapphire, SiC, Si, GaN or the like. The plurality of semiconductor layers 30, 40, 50 includes a buffer layer (not shown) formed on the growth substrate 10, a first semiconductor layer 30 (e.g., Si-doped GaN) having a first conductivity type, a second semiconductor layer 50 (e.g., Mg-doped GaN) having a second conductivity type different from the first conductivity type, and an active layer 40 (e.g., InGaN/(In)/GaN multiple quantum well structure) which is interpositioned between the first semiconductor layer 30 and the second semiconductor layer 50 and generates light by electron-hole recombination. Each of the semiconductor layers 30, 40, 50 may have a multi-layered structure, and the buffer layer may be omitted. The positions of the first semiconductor layer 30 and second semiconductor layer 50 may be exchanged, and these semiconductor layers are made primarily of GaN in the case of Group III-nitride semiconductor light emitting devices. The first electrode 80 is in electrical communication with the first semiconductor layer 30 and supplies electrons thereto. The second electrode 70 is in electrical communication with the second semiconductor layer 50 and supplies holes thereto.

As shown in FIG. 21a, a light reflective layer R is interpositioned between the second semiconductor layer 80 and the electrodes 70, 80. The light reflective layer R may have a multilayered structure including an insulation layer, a DBR (Distributed Bragg Reflector) or ODR (Omni-Directional Reflector). Optionally, as shown in FIG. 10b, a metallic reflective layer R may be provided on the second semiconductor layer the electrode 70 may be provided on the metallic reflective layer R, and an exposed portion of the first semiconductor layer 50 by mesa-etching may communicate with the other electrode 80. The device carrier 501 described above can recognize the shape or pattern of these electrodes 70, 80.

Figure 22:
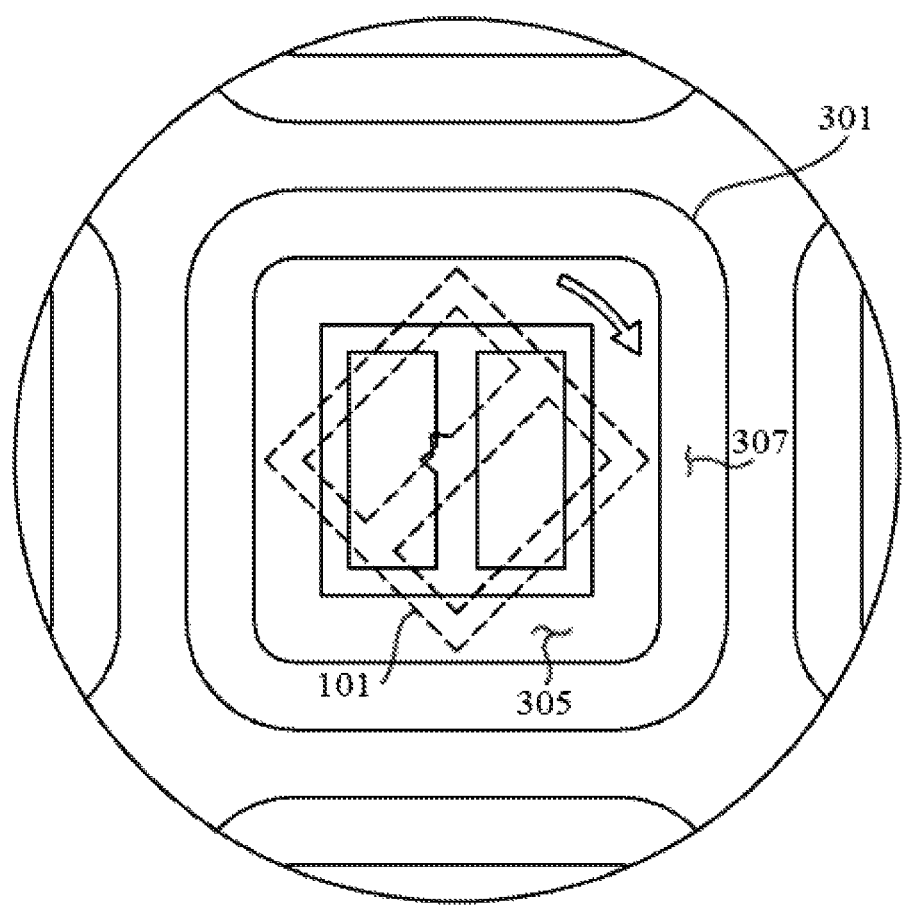

FIG. 22 is a schematic illustrating of an example showing how the device carrier 501 recognizes a shape or pattern of a dam 301 to calibrate angle and position of a semiconductor light emitting chip to be placed. When the sorter 5 (see FIG. 2) is running at a high speed, it might leave out a semiconductor light emitting chip 101 on the tape, thereby creating a vacancy (see 14 in FIG. 3), and it might also skew a semiconductor light emitting chip slightly (see 16 in FIG. 3). As shown in FIG. 20a, the device carrier 501 is capable of recognizing any vacancy 14 and picking up the semiconductor light emitting chip 101 at the next position. When the device carrier 501 picks up the semiconductor light emitting chip 101, it can recognize a pattern (e.g., electrode separating line) of the electrodes 80, 70 in the semiconductor light emitting chip 101 to calibrate an angle of the chip. In addition, as shown in FIG. 22, the device carrier 501 recognizes a shape of the dam 301 and calibrates position or angle of the semiconductor light emitting chip 101 such that the chip is placed with precision and accuracy on an exposed portion of the base 201 through a corresponding opening 305. To accomplish this, the device carrier 501 may use a camera or optical sensor. For example, the base 201 and the dam 301 may have different materials or colors or be subjected to surface treatment to exhibit a different light reflectance from each other. In turn, the device carrier 501 can sense a difference in brightness, light reflectance or reflected light between the dam 301 and the base 201, or recognize a shape or form of the opening 305 of interest. It does not necessarily have to recognize the entire shape or form opening 305, but may recognize only a part thereof. Thus, the device carrier 501 can place a semiconductor light emitting chip 101 at a position on the base 201, which corresponds to a designated distance away from or coordinates with respect to at least one of the face, edge and point of the dam 301, in an opening 305. Besides, other approaches may also be applied to recognize a pattern of the dam 301 or opening 305, and to obtain the coordinates of a target semiconductor light emitting chip 101 based on the pattern. In this embodiment, the base 201 does not have a specific pattern on it, and the dam 301 or opening 305 is used as a reference for obtaining the coordinates of a semiconductor light emitting chip 101 of interest.

In short, the positional and angular alignment of semiconductor light emitting chips 101 is done with higher precision and accuracy, as compared with the case where semiconductor light emitting chips are simply arranged on a flat base 201 by means of a sorter 5 at predetermined spaced intervals with respect to an initially placed semiconductor light emitting chip 101.

Figure 23:
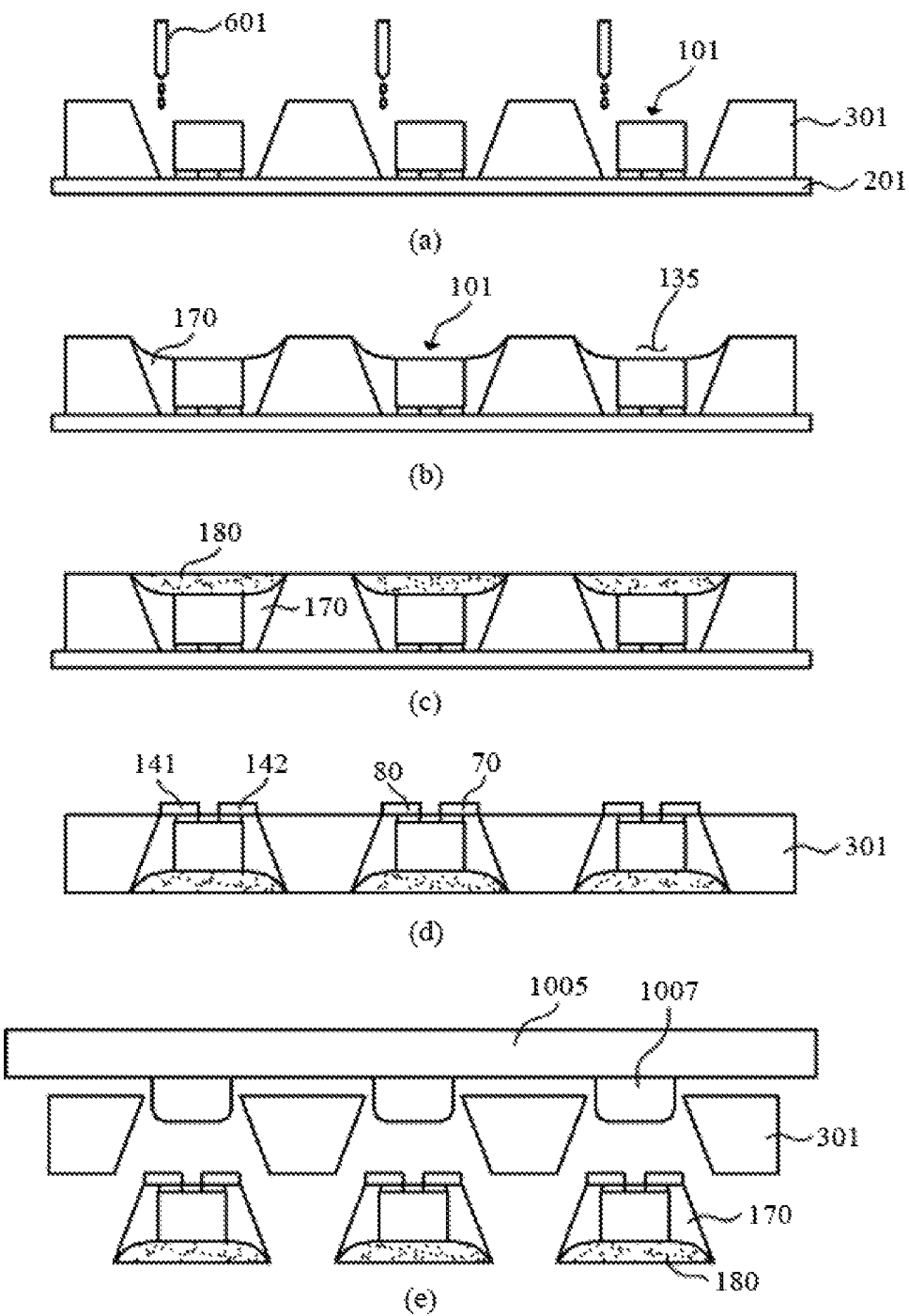

Referring to FIG. 23, a non-transmissive material is fed between the inclined lateral side of the dam 301 and the lateral side of the semiconductor light emitting chip 101 as shown in FIG. 23a, to form a wall 170 having an elevated upper end 173 caused by surface tension effects, as shown in FIG. 23b, and the wall 170 is then cured or hardened. An encapsulant 180 is formed in a bowl 135 defined by the wall 170 and the semiconductor light emitting part 105, as shown in FIG. 23c. Next, a base 201 removed and first and second conductive parts 141 and 142 are formed, as shown in FIG. 23d. Finally, a plurality of semiconductor light emitting devices is taken out from the dam 301. Taking out these semiconductor light emitting devices from the dam 301 can be done by using a sorter or other similar equipment. Optionally, a plate 1005 having an embossed pattern 1007 may be used to push off the semiconductor light emitting device from the dam 301, and the semiconductor light emitting device can then be picked up using vacuum suction techniques or by electric clamping means and carried. If a testing process is performed first as described in FIG. 25 and FIG. 26, semiconductor light emitting devices can be picked up and then sorted at the same time, based on the testing results. Due to a certain level of adhesion present between the dam 301 and the wall 170, if an excessively strong force is applied for taking out the device, a semiconductor light emitting device thus obtained would have been damaged. Therefore, it can be envisaged to incorporate a structure for controlling an adhesive force between the dam 301 and the wall 170 as described in FIG. 17c such that a semiconductor light emitting device of interest can easily be taken out from the mask 301.

Figure 24:
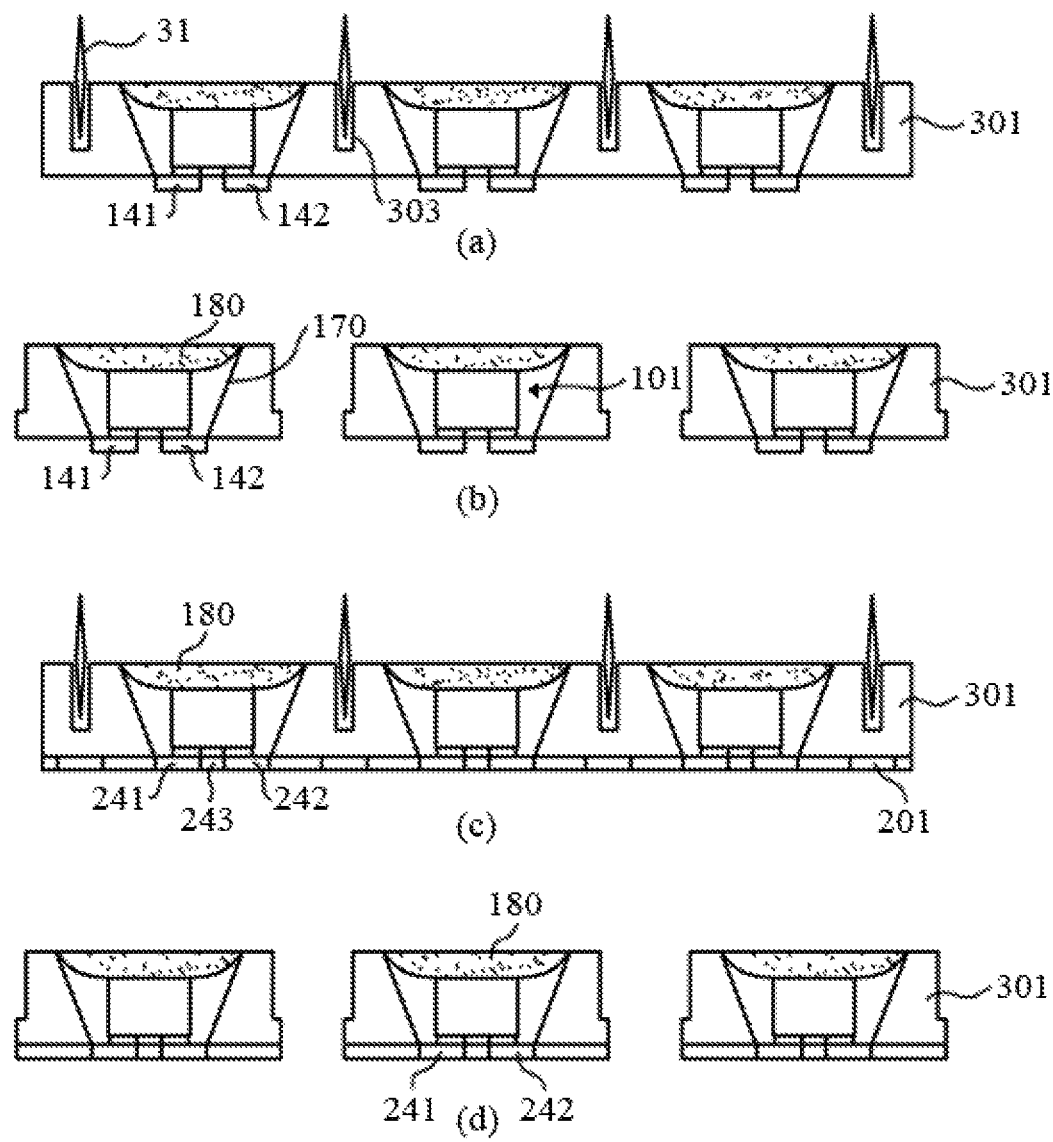
FIG. 24 is a schematic illustration for describing other exemplary embodiments of a semiconductor light emitting device according to the present disclosure.

FIG. 24 is a schematic illustration for describing other exemplary embodiments of a semiconductor light emitting device according to the present disclosure. Following the formation of an encapsulant 180, or first and second conductive parts 141 and 142, a dam 301 is cut as shown in FIG. 24a. A semiconductor light emitting device thus obtained has the cut dam 301 attached to the outer lateral side 172 of a wall 170 as shown in FIG. 24b. Cutting grooves 303 may be formed in the dam 301 to facilitate the cutting process. This cutting process can be accomplished by employing a cutter or a laser scribing technique. The cutter is introduced to the cutting groove 303 to cut the dam 301, or a scribing and breaking operation may be performed to cut or scribe a portion of the dam 301 while breaking another portion of the dam 301. Alternatively, a breaking operation is simply performed along the cutting groove 303 to break out the dam.

In another exemplary embodiment, when the base 201 is a plate having a first conductive part 241, an insulating part 243 and a second conductive part 242 as shown in FIG. 24c, the base 201 is not removed and the dam 301 is cut, thereby obtaining a semiconductor light emitting device shown in FIG. 24d. The cut dam 301 attached to the wall 170 can contribute to the improvement of bonding strength, heat protection efficiency and so on. The breaking techniques, when used for cutting the dam 301 in this exemplary embodiment, provides a number of advantages over others in that cutting grooves 303 are formed beforehand at precise intervals, and that semiconductor light emitting devices of uniform size can be produced as the cutting process is performed along the cutting grooves 303. Moreover, in the case of cutting over full height or width of the dam 301 from bottom to top, the cutting process is often under stress by an external force such that there is a risk of producing a defective semiconductor light emitting device. However, the presence of cutting grooves 303 as in this embodiment reduces stress and therefore, the resulting semiconductor light emitting device is substantially less damaged or destroyed. In addition, an amount of breaking time is shortened. As a result, the efficiency of the cutting process is improved, and defects in a semiconductor light emitting device thus obtained are reduced.

A semiconductor light emitting device obtained has a matching shape with an opening 305 formed in a mask 301.

The opening 305 in the mask 301, if seen in a top view, may be transformed into a polygonal shape including a rounded-edge quadrangular or triangular shape and the like, a circular shape or an oval shape. Also, the encapsulant 180 if seen in a top view may be formed into a polygonal shape including a quadrangular or triangular shape, or a circular shape or an oval shape. With this transformation, the shape of the encapsulant 180 can influence an amount and direction of light emitted from the semiconductor light emitting device.

Figure 25:
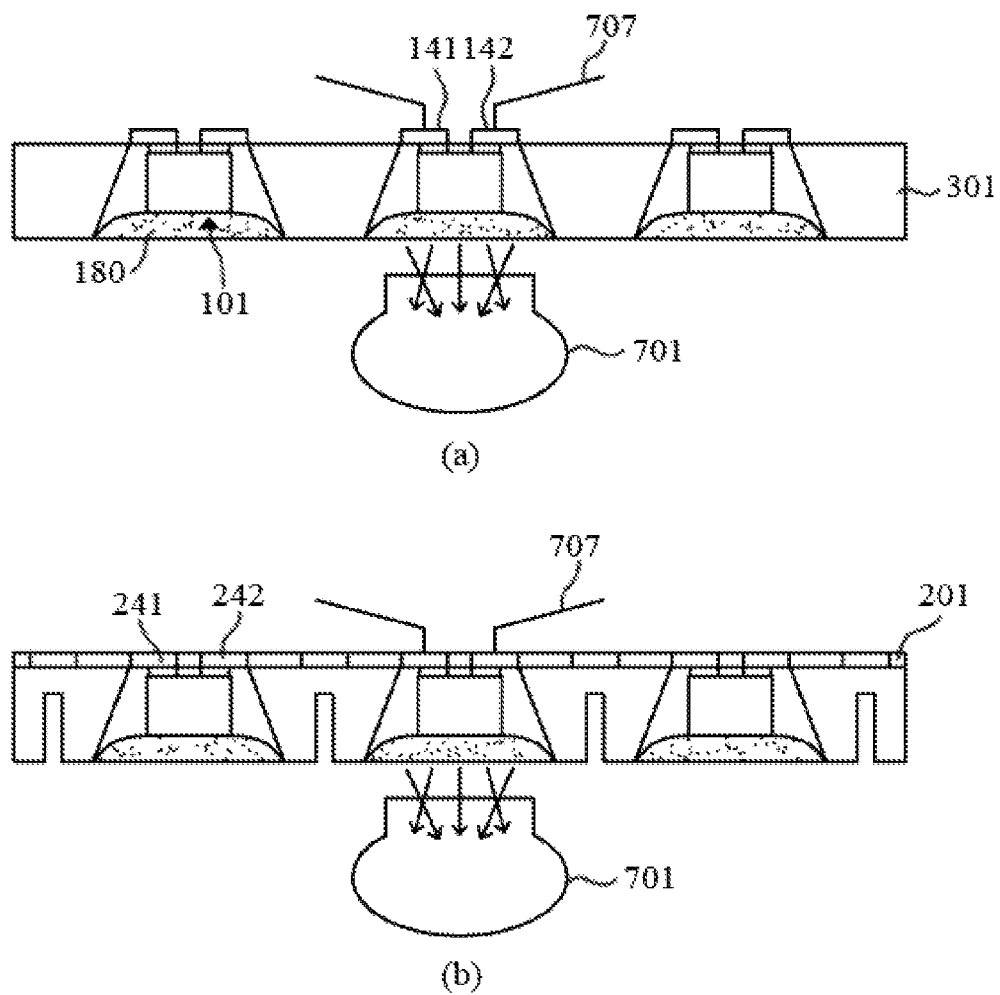
FIG. 25 and FIG. 26 are schematic illustrations for describing exemplary methods for testing a semiconductor light emitting device according to the present disclosure.
Figure 26:
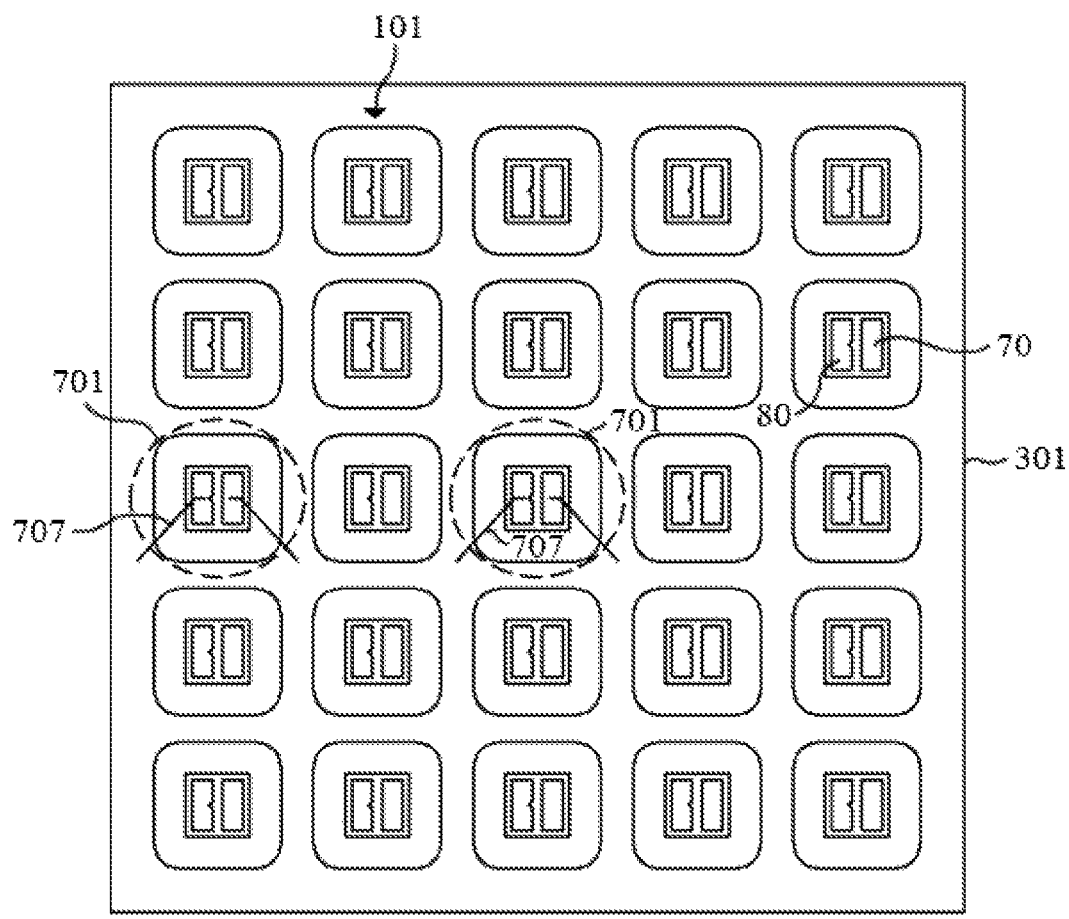

FIG. 25 and FIG. 26 are schematic illustrations showing exemplary embodiments of a method for testing a semiconductor light emitting device according to the present disclosure. This semiconductor light emitting testing method can be included in a process of a method for manufacturing a semiconductor light emitting device according to the present disclosure. In this testing method, either an assembly of a semiconductor light emitting chip 101, a wall 170, an encapsulant 180, a first conductive part 141, a second conductive part 142 and a dam as shown in FIG. 25a is tested, or an assembly having first and second conductive parts 241 and 242 in a base 201 as shown in FIG. 25b is tested. Alternatively, without having the first conductive part 141 and the second conductive part 142, the assembly in FIG. 25a may be tested by bringing a probe 707 into contact with a first electrode 80 and a second electrode 70 therein.

Once the assembly is prepared, optical measuring equipment 701 is arranged on the side of the encapsulant 180 to receive light. A current is then applied to the probe in contact with the first conductive part 141 or 241 and the second conductive part 142 or 242 of a selected semiconductor light emitting device, such that light from the semiconductor light emitting chip 101 is measured by the optical measuring equipment 701.

For highly accurate optical measurement of a semiconductor light emitting device, it is desirable to receive as much light as possible from the semiconductor light emitting device, and measure properties of the received light in absence of interference from the surroundings thereof. In these exemplary embodiments, when the optical measurement is carried out, the wall 170 around the encapsulant 180 reflects a portion of light from the semiconductor light emitting chip 101 towards the optical measuring equipment 701, and blocks the light from entering the encapsulant 180 adjacent to it. Further, as discussed previously, optical measurement is improved as the beam angle is relatively narrow due to the shape of the upper end 173 of the wall 170 and the shape of the bowl 135.

Therefore, it is not even necessary to put a semiconductor light emitting device to the test inside the optical measuring equipment 701, to confirm a substantially reduced light leakage. Moreover, the optical measuring equipment is capable of making optical measurements not only in absence of phosphorus interference from the surroundings thereof, but also with high precision nearly comparable to that of the optical measuring equipment 701 performing optical measurement on an individual semiconductor light emitting device that is put completely within the optical measuring equipment. In addition, to facilitate faster testing, either the optical measuring equipment 701 or the assembly may be shifted.

An example of the optical measuring equipment 701 may include an integrating sphere. For instance, the integrating sphere 701, 705 is a spherical device having a hollow space inside, which measures properties of light having entered the hollow space.

Referring to FIG. 26, according to another method for testing a semiconductor light emitting device of this exemplary embodiment, an optical measurement test can resolve conventional errors that are generally made while testing a semiconductor light emitting device inside the dam 301 and a semiconductor light emitting device on the corner thereof. For instance, a test may be performed on a plurality of tape-bonded semiconductor light emitting devices without a wall 170 or a dam 301, or on each semiconductor light emitting device without the wall 170, being entirely enclosed by an encapsulant 180. Here, in an array of a plurality of semiconductor light emitting devices, lightly is generally uniformly scattered around those semiconductor light emitting devices located at the inner side of the tape. Meanwhile, light is scattered differently around those semiconductor light emitting devices on the corners of the tape, depending on whether there is a neighboring semiconductor light emitting device, and therefore, light measurements obtained from the inner side of the tape are different from light measurements obtained from the corners of the tape. However, if the semiconductor light emitting devices from the inner side of the tape as well as the semiconductor light emitting devices from the corners of the tape are placed individually in an integrating sphere and tested, substantially equal light measurements are obtained.

According to the semiconductor light emitting device testing method in this embodiment, the wall 170 or the dam 301 surrounding each semiconductor light emitting device can serve as a reflector. As such, conditions stay the same at the inner side and on the corners, thereby allowing the optical measurements to be performed with higher accuracy and precision.

Figure 27:
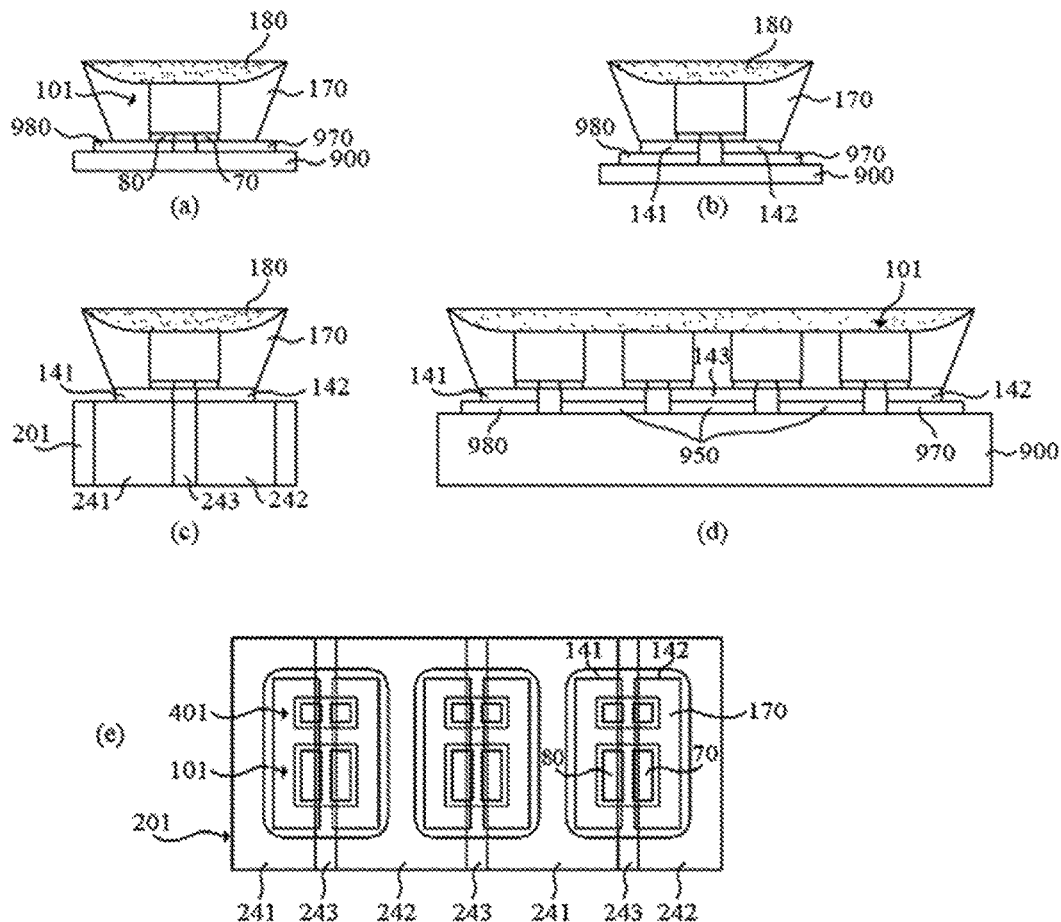
FIG. 27 is a schematic illustration for describing other exemplary embodiments of a semiconductor light emitting device and a method for manufacturing the same according to the present disclosure.

FIG. 27 is a schematic illustration for describing other exemplary embodiments of a semiconductor light emitting device and a method for manufacturing the same according to the present disclosure. This method for manufacturing a semiconductor light emitting device further includes a process of mounting the resulting semiconductor light emitting device on a circuit board 980, 970 such as a PCB, following the processes described in FIG. 7 to FIG. 26. For instance, as shown in FIG. 27a, a first electrode 80 and a second electrode 70 of a semiconductor light emitting device can be bonded directly or by soldering to external electrodes 980, 970 of a PCB 900. Alternatively, as shown in FIG. 27b, a first electrode part 141 and a second electrode part 142 of a semiconductor light emitting device can be bonded to the external electrodes 980, 970 of the PCB 900. Alternatively, as shown in FIG. 27d, a semiconductor light emitting device having a plurality of semiconductor light emitting chips 101 may be bonded to the external electrodes 980, 970, 950 of the PCB 900.

Meanwhile, as shown in FIG. 27c, a first electrode part 141 of a semiconductor light emitting device is bonded to a first conductive part 241 of a plate 201, and a second electrode part 142 of the semiconductor light emitting device is bonded to a second conductive part 242 of the plate 201. Moreover, an insulating parts 243 of the plate 201 may be mounted between the first electrode 80 and the second electrode 70 correspondingly. This plate 201 may be adapted to have circuitry. In that case, the plate 201 can serve not only as a circuit board like a PCB, but also as a heat sink.

Alternatively, as shown in FIG. 27e, a semiconductor light emitting chip and a functional element can be electrically connected by a first conductive part 241 and a second conductive part 242. Alternatively, a first conductive part 141 and a second conductive part 142 may be omitted, and a first electrode 80 and a second electrode 70 may directly come in contact with the first conductive part 241 and the second conductive part 242 of the plate.

Figure 28:
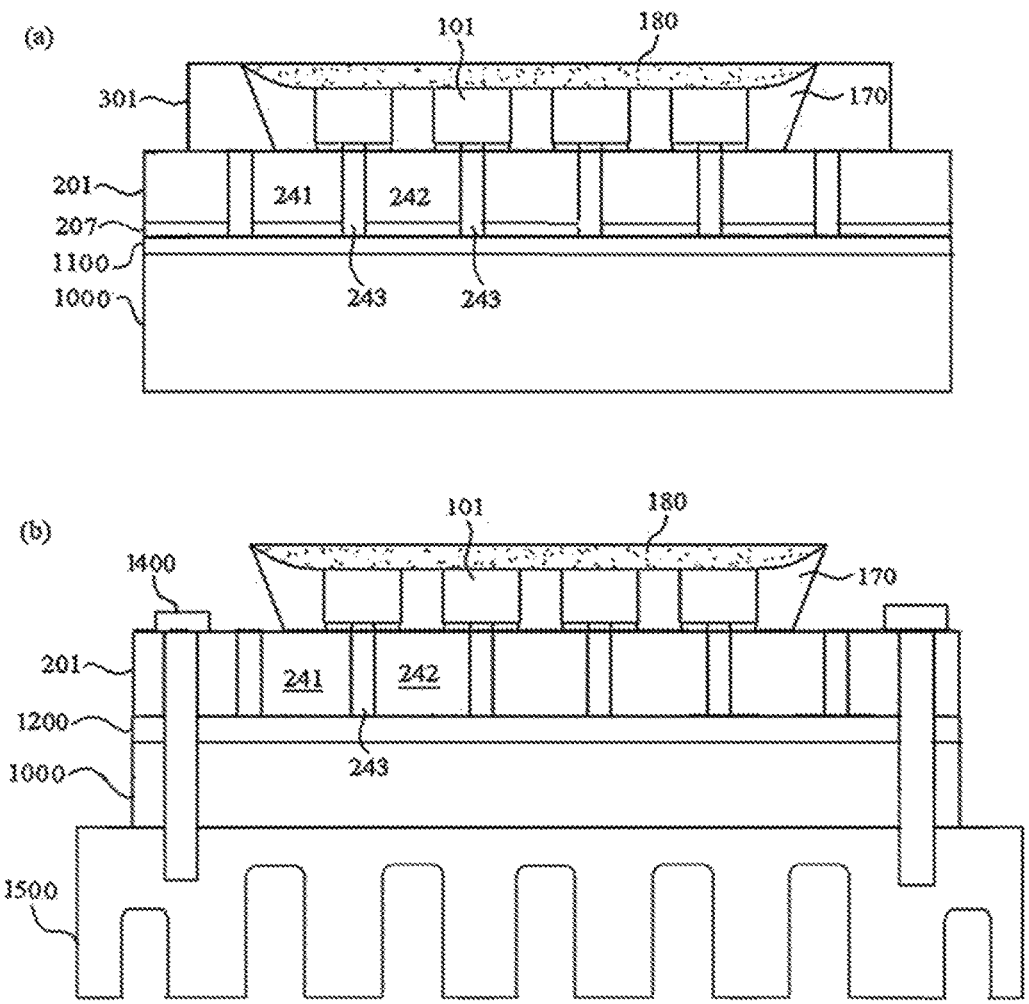
FIG. 28 is a schematic illustration for describing other exemplary embodiments of a semiconductor light emitting device and a method for manufacturing the same according to the present disclosure.

FIG. 28 is a schematic illustration for describing other exemplary embodiments of a semiconductor light emitting device and a method for manufacturing the same according to the present disclosure. As shown in FIG. 28a, a dam 301 is first placed on a plate 201, and one or more semiconductor light emitting chips 101 are directly mounted on first and second conductive parts 241 and 242 of the plate 201, which are exposed to the dam. A wall 170 is formed within the dam 301 that surrounds the one or more semiconductor light emitting chips 101, and an encapsulant can be formed. An oxide 207 is then formed on the bottom face of the plate 201 by anodizing, and the oxide is bonded to a metal base 1000 (a heat protecting part, e.g., an Al plate) by means of an adhesive layer 1100. Here, the plate 201 (a power transfer substrate) and the metal base 1000 may be replaced with a conventional metal PCB.

In another alternative embodiment, as shown in FIG. 28b, an assembly free of a dam is provided on the plate 201, and the assembly is then bonded to the metal base 1000 by an insulating layer 1200 or coupled to a heat sink 1500 using screws 1400.

The following will now describe various embodiments of the present disclosure.

(1) A semiconductor light emitting device, characterized by including: a semiconductor light emitting chip having a semiconductor light emitting part for generating light by electron-hole recombination, and at least one electrode electrically connected to the semiconductor light emitting part; a wall placed on a lateral side of the semiconductor light emitting part, with the wall having an elevated upper end caused by surface tension effects; and an encapsulant arranged in a bowl that is defined by the upper end of the wall and the semiconductor light emitting part, with the encapsulant for transmitting therethrough a light from the semiconductor light emitting part.

(2) The semiconductor light emitting device is characterized in that the upper end of the wall has an outer edge higher than the lateral side of the semiconductor light emitting part.

(3) The semiconductor light emitting device is characterized in that the upper end of the wall is curved concave inward towards a lower end of the wall.

(4) The semiconductor light emitting device is characterized in that the wall is a reflector.

(5) The semiconductor light emitting device is characterized in that it includes a phosphor contained in the encapsulant.

(6) The semiconductor light emitting device is characterized in that the wall has an outer lateral side inclined in such a manner that the outer lateral side is farther from the semiconductor light emitting part at the upper end of the wall than at the lower end of the wall.

(7) The semiconductor light emitting device is characterized in that it further includes a dam which is placed on the opposite of the semiconductor light emitting chip with respect to the wall and has an inclined side in contact with the wall, and the upper end of the wall arises along the inclined side of the dam caused by surface tension effects.

(8) The semiconductor light emitting device is characterized in that the semiconductor light emitting part includes: a plurality of semiconductor layers composed of a first semiconductor layer having a first conductivity type, a second semiconductor layer having a second conductivity type different from the first conductivity type, and an active layer interpositioned between the first semiconductor layer and the second semiconductor layer, for generating light by electron-hole recombination; and a substrate disposed between the plurality of semiconductor layers formed thereon and an encapsulant, and that the at least one electrode includes a first electrode being disposed on the substrate opposite to the plurality of semiconductor layers and supplying electrons or holes to the first semiconductor layer; and a second electrode being disposed on the substrate opposite to the plurality of semiconductor layers and supplying electrons or holes, whichever are not supplied to the first semiconductor layer, to the second semiconductor layer.

(9) The semiconductor light emitting device is characterized in that it further includes a first conductive part formed on the lower end of the wall to come in contact with the first electrode, and a second conductive part formed on the lower end of the wall, with the second conductive part being positioned a distance away from the first conductive part.

(10) The semiconductor light emitting device is characterized in that it includes a plurality of semiconductor light emitting chips, the wall is adapted to surround lateral sides of the plurality of semiconductor light emitting chips, and the encapsulant covers exposed portions of the plurality of semiconductor light emitting chips from the wall.

(11) The semiconductor light emitting device is characterized in that it further includes a flip chip-type functional element having two electrical terminals, with the two electrical terminals being at least partially surrounded with the wall to be exposed towards the first electrode and the second electrode.

(12) A method for manufacturing a semiconductor light emitting device, the method including: placing a dam having an opening formed therein onto a base, and placing a semiconductor light emitting chip onto an exposed portion of the base through the opening, with the semiconductor light emitting chip having a semiconductor light emitting part for generating light by electron-hole recombination and at least one electrode electrically connected to the semiconductor light emitting part; forming a wall between a lateral side of the dam and a lateral side of the semiconductor light emitting part, with the wall having an elevated upper end caused by surface tension effects; and forming an encapsulant in a bowl that is defined by the upper end of the wall and the semiconductor light emitting part.

(13) The method for manufacturing a semiconductor light emitting device is characterized in that in step of forming a wall, the lateral side of the dam is inclined with respect to the base, and the upper end of the wall is formed as a light reflective material fed between the lateral side of the dam and the lateral side of the semiconductor light emitting part arises along the lateral side of the dam due to surface tension effects.

(14) The method for manufacturing a semiconductor light emitting device is characterized in that the upper end of the wall is formed such that, relative to the base, the lateral side of the dam is higher than the lateral side of the semiconductor light emitting part.

(15) The method for manufacturing a semiconductor light emitting device is characterized in that the semiconductor light emitting chip is a flip chip, and the at least one electrode includes a first electrode and a second electrode disposed on an opposite side of the encapsulant with respect to the semiconductor light emitting part, and the method further includes: after forming the encapsulant, separating the base from the dam and the wall; and forming a first conductive part on the lower end of the wall to come in contact with the first electrode, and a second conductive part on the lower end of the wall to come in contact with the second electrode, respectively.

(16) The method for manufacturing a semiconductor light emitting device is characterized in that in step of placing a dam and a semiconductor light emitting chip on the base, a plurality of semiconductor light emitting chips is placed in a single opening, and the wall is filled in a space between lateral sides of the semiconductor light emitting chips.

(17) The method for manufacturing a semiconductor light emitting device is characterized in that in step of placing a dam and a semiconductor light emitting chip on the base, a flip chip-type functional element having two electrical terminals exposed to the first and second electrodes is placed together with the semiconductor light emitting chip in the opening, and that in step of forming a wall, at least a portion of the functional element is covered with the wall.

(18) The method for manufacturing a semiconductor light emitting device is characterized in that it further includes: separating all parts from the dam.

(19) The method for manufacturing a semiconductor light emitting device is characterized in that it further includes: cutting the dam to obtain an assembly having the cut dam and the other parts.

(20) The method for manufacturing a semiconductor light emitting device is characterized in that in step of placing a dam and a semiconductor light emitting chip on a base includes the processes of: placing a dam having an opening formed therein onto the base; and placing a semiconductor light emitting chip on an exposed portion of the base through the opening, using a device carrier which recognizes a shape of the dam and calibrates a position for a semiconductor light emitting chip to be seated.

In a semiconductor light emitting device and a method for manufacturing the same according to the present disclosure, it is possible to control an angle of inclination of the lateral side of a dam, which in turn enables to change the shapes of the lateral side and upper end of the wall.

In a semiconductor light emitting device and a method for manufacturing the same according to the present disclosure, only a required amount of a phosphor is contained in the bowl such that a difference in the excitation degrees of the phosphor by light is smaller than that of the semiconductor light emitting device.

In a semiconductor light emitting device and a method for manufacturing the same according to the present disclosure, the semiconductor light emitting device thus obtained has a very advantageous structure for manufacturing smaller scale devices, and the wall around the semiconductor light emitting chip can be made compact, thereby obtaining a CSP (Chip Scale Package) semiconductor device.

Moreover, an excessive use of a phosphor can be prevented by using only a required amount of a phosphor in the bowl.

In a semiconductor light emitting device and a method for manufacturing the same according to the present disclosure, the semiconductor light emitting device thus obtained has a very efficient structure for use as an SMD (Surface Mount Device) that is mounted directly on a circuit board like a PCB.

DESCRIPTION OF REFERENCE NUMERALS

| | |
|---|---|
| 70, 80: Electrode | 101: Semiconductor light emitting chip |
| 201: Base | 301: Opening    170: Wall |
| 180: Encapsulant | 701: Optical measuring equipment |
| 401: Functional element | |

What is claimed is:

1. A method for manufacturing a semiconductor light emitting device, the method comprising:
    placing a dam having an opening formed therein onto a base, and placing a semiconductor light emitting chip onto an exposed portion of the base through the opening, with the semiconductor light emitting chip having a semiconductor light emitting part for generating light by electron-hole recombination and at least one electrode electrically connected to the semiconductor light emitting part;
    forming a wall comprising a light reflective material between a lateral side of the dam and a lateral side of the semiconductor light emitting part without the wall covering an upper side of the semiconductor light emitting part, the wall having an elevated upper end due to surface tension effects;
    forming an encapsulant in a bowl defined by the upper end of the wall and the upper side of the semiconductor light emitting part, with the generated light transmitted to the encapsulant through the upper side of the semiconductor light emitting part; and
    separating the base from the semiconductor light emitting chip, the dam and the wall in such a manner that the at least one electrode is exposed through the opening of the dam for electric contact.

2. The method according to claim 1, wherein when forming the wall, the lateral side of the dam is inclined with respect to the base, and the upper end of the wall is formed as a light reflective material fed between the lateral side of the dam and the lateral side of the semiconductor light emitting part and arises along the lateral side of the dam due to surface tension effects.

3. The method according to claim 1, wherein the upper end of the wall is formed, relative to the base, with the lateral side of the dam higher than the lateral side of the semiconductor light emitting part.

4. The method according to claim 1, wherein the semiconductor light emitting chip is a flip chip, the at least one electrode comprises a first electrode and a second electrode disposed on an opposite side of the encapsulant with respect to the semiconductor light emitting part, and the method further comprises:
    forming a first conductive part on a lower end of the wall to contact the first electrode, and a second conductive part on the lower end of the wall to contact the second electrode, respectively.

5. The method according to claim 4, wherein when placing the dam and the semiconductor light emitting chip on the base, a plurality of semiconductor light emitting chips are placed in a single opening, and the wall is filled in a space between lateral sides of the semiconductor light emitting chips.

6. The method according to claim 4, wherein:
    when placing the dam and the semiconductor light emitting chip on the base, a flip chip-type functional element having two electrical terminals exposed to the first and second electrodes is placed together with the semiconductor light emitting chip in the opening; and
    when forming a wall, at least a portion of the functional element is covered by the wall.

* * * * *